US012733784B2

(12) United States Patent
Kim et al.

(10) Patent No.: US 12,733,784 B2
(45) Date of Patent: Sep. 15, 2026

(54) CORDLESS VACUUM CLEANER ADOPTING OVERHEATING PROTECTION METHOD

(71) Applicant: SAMSUNG ELECTRONICS CO., LTD., Suwon-si (KR)

(72) Inventors: Hyeongjun Kim, Suwon-si (KR); Minji Kim, Suwon-si (KR); Seungjoon Hwang, Suwon-si (KR); Daehyung Kim, Suwon-si (KR); Yongseok Kim, Suwon-si (KR); Kyungjin Oh, Suwon-si (KR); Jaeshik Jeong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 84 days.

(21) Appl. No.: 18/818,675

(22) Filed: Aug. 29, 2024

(65) Prior Publication Data

US 2024/0415354 A1 Dec. 19, 2024

Related U.S. Application Data

(63) Continuation of application No. PCT/KR2024/006916, filed on May 22, 2024.

(30) Foreign Application Priority Data

May 25, 2023 (KR) ........................ 10-2023-0067724
Jul. 28, 2023 (KR) ........................ 10-2023-0099053

(51) Int. Cl.
*A47L 9/28* (2006.01)
*A47L 9/00* (2006.01)
(Continued)

(52) U.S. Cl.
CPC ........... *A47L 9/2889* (2013.01); *A47L 9/0063* (2013.01); *A47L 9/2857* (2013.01); *A47L 9/2873* (2013.01);
(Continued)

(58) Field of Classification Search
CPC ........ A47L 9/0063; A47L 9/28; A47L 9/2805; A47L 9/2857; A47L 9/2873;
(Continued)

(56) References Cited

U.S. PATENT DOCUMENTS 8,096,706 B2 * 1/2012 Lee .......................... G01K 7/01 374/170
8,564,248 B2 10/2013 Park
(Continued)

FOREIGN PATENT DOCUMENTS

CN 106264358 A 1/2017
CN 216720956 U 6/2022
(Continued)

OTHER PUBLICATIONS

International Search Report corresponding to Application No. PCT/KR2024/006916; Dated Aug. 26, 2024.
(Continued)

*Primary Examiner* — Kevin J Comber
(74) *Attorney, Agent, or Firm* — CANTOR COLBURN LLP

(57) ABSTRACT

A cordless vacuum cleaner includes a cleaner main body and a station. The cleaner main body includes a battery and a first processor controlling performing a cleaning function using power of the battery. The station includes a power conversion device to generate a voltage to charge the battery of the cleaner main body, a second charge terminal to charge the battery of the cleaner main body with the voltage generated by the power conversion device, a temperature sensor installed within a distance from the second charge terminal and to detect a temperature of the second charge terminal, a divider resistor to provide a voltage by dividing of an input voltage with the temperature sensor, and a second processor controlling performing an overheating prevention operation
(Continued)

based on a voltage level of the voltage provided by the divider resistor and the temperature sensor being greater than a threshold voltage level.

17 Claims, 25 Drawing Sheets

(51) Int. Cl.

| | |
|---|---|
| ***G01K 7/22*** | (2006.01) |
| ***G01R 15/04*** | (2006.01) |
| ***G01R 19/165*** | (2006.01) |
| ***G01R 19/22*** | (2006.01) |
| ***H02H 5/04*** | (2006.01) |

(52) U.S. Cl.
CPC .............. *A47L 9/2884* (2013.01); *G01K 7/22* (2013.01); *G01R 15/04* (2013.01); *G01R 19/16576* (2013.01); *G01R 19/22* (2013.01); *H02H 5/04* (2013.01); *A47L 2201/022* (2013.01)

(58) Field of Classification Search
CPC .... A47L 9/2884; A47L 9/2889; A47L 9/2894; A47L 2201/022; B25J 11/00; B25J 13/00; G01K 7/22; G01R 15/04; G01R 19/16576; G01R 19/22; H02H 5/04; H02J 7/00
USPC .......................................................... 361/103
See application file for complete search history.

(56) References Cited

U.S. PATENT DOCUMENTS

| | | | | |
|---|---|---|---|---|
| 9,778,321 | B2 | 10/2017 | Umemura et al. | |
| 9,884,423 | B2 | 2/2018 | Cohen et al. | |
| 10,714,943 | B2 * | 7/2020 | Zhang | H02H 7/18 |
| 10,971,942 | B2 | 4/2021 | Jung et al. | |
| 11,006,802 | B2 | 5/2021 | Watanabe et al. | |
| 11,322,958 | B2 | 5/2022 | Park et al. | |
| 11,855,476 | B2 | 12/2023 | Shin et al. | |
| 11,925,307 | B2 | 3/2024 | Mitsui et al. | |
| 2004/0067625 | A1 | 4/2004 | Pfirsch | |
| 2009/0015208 | A1 | 1/2009 | Seman, Jr. et al. | |
| 2010/0028760 | A1 * | 2/2010 | Park | G06F 1/206 429/62 |
| 2015/0048804 | A1 * | 2/2015 | Toivanen | H02J 7/685 320/162 |
| 2015/0123616 | A1 * | 5/2015 | Oku | H02J 7/04 320/114 |
| 2021/0126478 | A1 * | 4/2021 | Park | B60L 53/16 |
| 2021/0194267 | A1 * | 6/2021 | Shin | H01M 10/443 |
| 2021/0344145 | A1 * | 11/2021 | O'Rourke | H01R 13/713 |
| 2023/0127745 | A1 * | 4/2023 | Lee | B60L 53/16 320/109 |

FOREIGN PATENT DOCUMENTS

| | | | |
|---|---|---|---|
| CN | 218071075 | U | 12/2022 |
| DE | 202018106517 | U1 | 2/2020 |
| GB | 2602984 | A | 7/2022 |
| JP | 2015106981 | A | 6/2015 |
| KR | 100548291 | B1 | 2/2006 |
| KR | 100692896 | B1 | 3/2007 |
| KR | 20100013514 | A | 2/2010 |
| KR | 101358475 | B1 | 2/2014 |
| KR | 101470364 | B1 | 12/2014 |
| KR | 101650178 | B1 | 8/2016 |
| KR | 20170054851 | A | 5/2017 |
| KR | 101788015 | B1 | 10/2017 |
| KR | 20210048063 | A | 5/2021 |

OTHER PUBLICATIONS

Extended European Search Report issued in Application No. EP 24811397-9-1015. Report mailed Jul. 16, 2026; 6 pages.

* cited by examiner

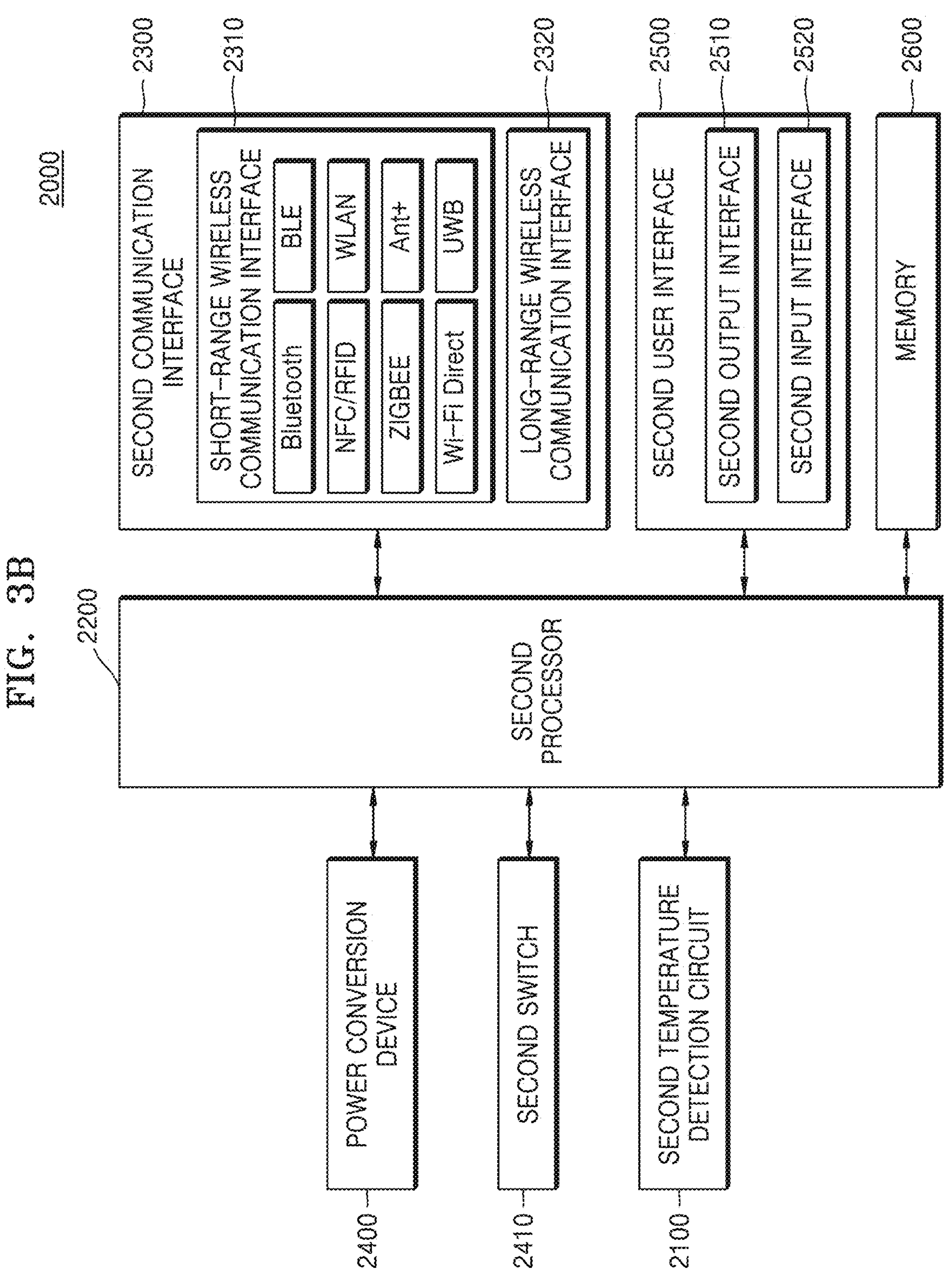
FIG. 3B
2000
SECOND COMMUNICATION INTERFACE
2300
SHORT-RANGE WIRELESS COMMUNICATION INTERFACE
2310
Bluetooth
BLE
NFC/RFID
WLAN
ZIGBEE
Ant+
Wi-Fi Direct
UWB
LONG-RANGE WIRELESS COMMUNICATION INTERFACE
2320
SECOND USER INTERFACE
2500
SECOND OUTPUT INTERFACE
2510
SECOND INPUT INTERFACE
2520
MEMORY
2600
SECOND PROCESSOR
2200
POWER CONVERSION DEVICE
2400
SECOND SWITCH
2410
SECOND TEMPERATURE DETECTION CIRCUIT
2100

FIG. 13

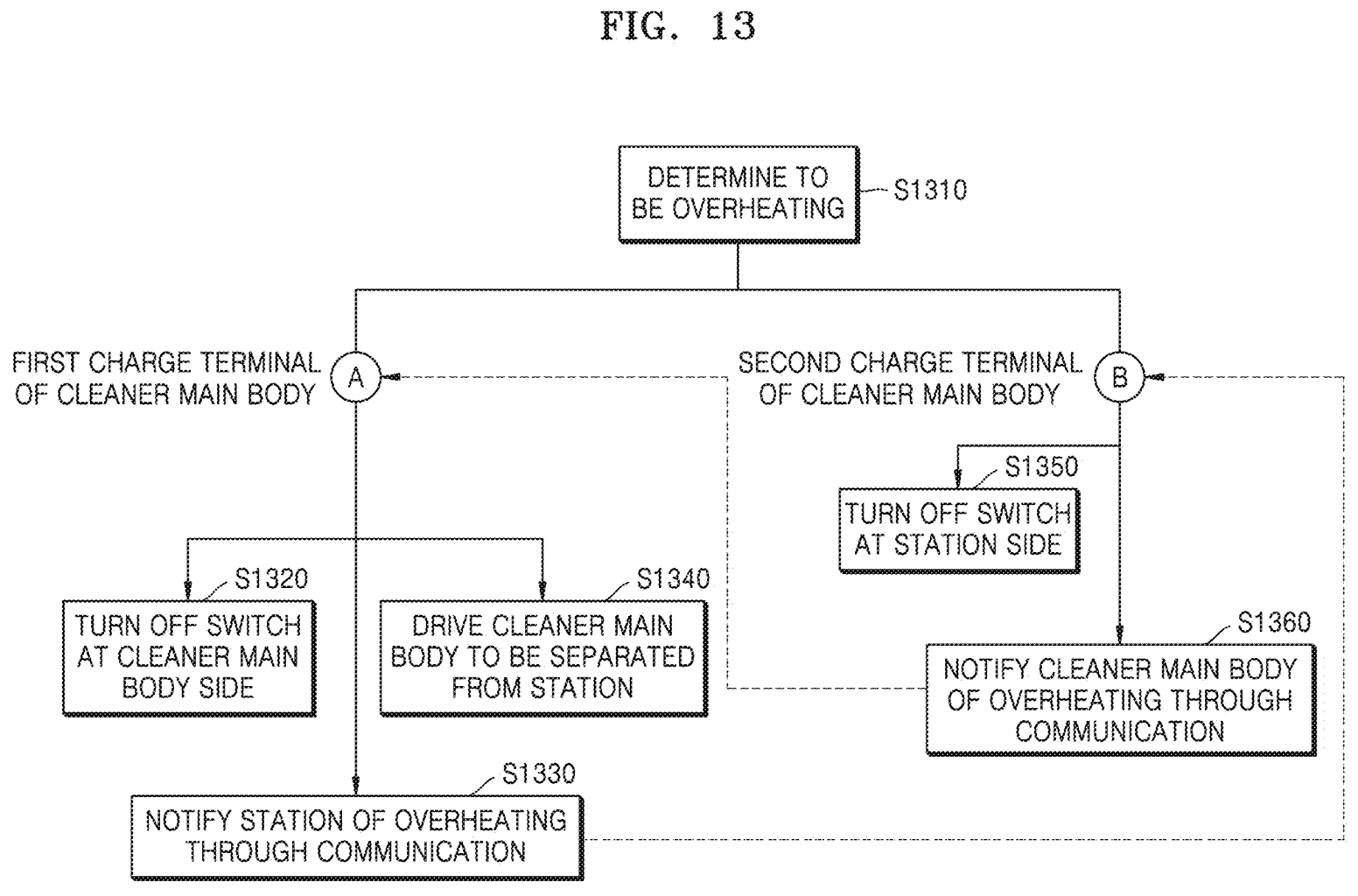

S1310 DETERMINE TO BE OVERHEATING

FIRST CHARGE TERMINAL OF CLEANER MAIN BODY (A)

S1320 TURN OFF SWITCH AT CLEANER MAIN BODY SIDE

S1330 NOTIFY STATION OF OVERHEATING THROUGH COMMUNICATION

S1340 DRIVE CLEANER MAIN BODY TO BE SEPARATED FROM STATION

SECOND CHARGE TERMINAL OF CLEANER MAIN BODY (B)

S1350 TURN OFF SWITCH AT STATION SIDE

S1360 NOTIFY CLEANER MAIN BODY OF OVERHEATING THROUGH COMMUNICATION

CORDLESS VACUUM CLEANER ADOPTING OVERHEATING PROTECTION METHOD

This application is a continuation application, claiming priority under § 365(c), of International Application No. PCT/KR2024/006916, filed on May 22, 2024, which is based on and claims the benefit of Korean Provisional Application No. 10-2023-0067724, filed on May 25, 2023, and Korean Patent Application No. 10-2023-0099053, filed on Jul. 28, 2023, the disclosures of which are incorporated by reference herein in their entireties.

TECHNICAL FIELD

An embodiment of the disclosure relates to a method of detecting overheating occurring in a charge terminal and preventing the overheating in a battery-driven cordless vacuum cleaner and to a cleaner adopting the method.

BACKGROUND ART

A cordless vacuum cleaner is a type of vacuum cleaner including a chargeable battery built into the vacuum cleaner, such that the vacuum cleaner may be operated without having to a power cord connected to an outlet. A cordless vacuum cleaner may include a suction motor for generating suction power to suction foreign materials, such as, for example, dust and the like, along with air from a cleaner head (brush) through suction power generated from the suction motor, and separate the suctioned foreign material from the air, thereby collecting dust.

Compared with a wired vacuum cleaner, a cordless vacuum cleaner that may be implemented without the connection of a power cord is very convenient to use. Thus, cordless vacuum cleaners have become popularized. However, the use forms of cordless vacuum cleaners may vary according to user and environment conditions. Recently, with respect to a cordless vacuum cleaner coupled to a station (dust discharger) that automatically empties dust in a dust container attached to a main body of the cordless vacuum cleaner when docked with the station, the use form, method, and structure of the vacuum cleaner have much diversified. As the main body of the cordless vacuum cleaner detaches or separates from the station to perform a cleaning function in a cordless state, the main body of the cordless vacuum cleaner may be fitted with a battery for powering the cordless vacuum cleaner. A battery is charged mainly when the main body of the cordless vacuum cleaner is electrically connected to the station. In some cases, in the electrically connected state, when overheating occurs in a charge terminal for electrically connecting the main body of the cordless vacuum cleaner to the station, the cordless vacuum cleaner may be damaged.

Further, as an example of a cordless vacuum cleaner, robot vacuum cleaners that automatically clean while a cleaner main body is moved by a motor drive force without user intervention have become popularized and widely used. A cleaner main body of a robot cleaner may autonomously perform a function of cleaning the floor while traveling in a certain area. Such a robot cleaner is generally equipped with a chargeable battery and various sensors for determining and avoiding obstacles while performing the function.

In this state, the cleaner main body of a robot cleaner is wirelessly driven through the battery. As the cleaner main body may provide a cleaning function and also various display functions, in some cases, the cordless vacuum cleaner may be implemented to support continuous battery charging. Some approaches for battery charging may include using a power conversion device. The cleaner main body may dock with a station including a power conversion device to charge the battery before and after a cleaning operation. For cases in which overheating may occur at a battery charge terminal, a protection function capable of preventing a robot cleaner from being damaged due to overheating is desired.

DISCLOSURE

Technical Solution

According to an embodiment of the disclosure, a cordless vacuum cleaner includes a battery and a first processor configured to control performing a cleaning function through power of the battery. In an embodiment of the disclosure, the cordless vacuum cleaner may further include a power conversion device configured to generate a voltage to charge the battery of the cleaner main body. In an embodiment of the disclosure, the cordless vacuum cleaner may further include a second charge terminal configured to charge the battery of the cleaner main body with the voltage generated by the power conversion device. In an embodiment of the disclosure, the cordless vacuum cleaner may further include a temperature sensor installed within a certain distance from the second charge terminal and configured to detect a temperature of the second charge terminal, and at least one divider resistor configured to divide a voltage level of an input voltage with the temperature sensor. In an embodiment of the disclosure, the cordless vacuum cleaner may further include a second processor configured to control performing an overheating prevention operation based on a voltage level determined by the at least one divider resistor and the temperature sensor being greater than a certain threshold voltage level.

In an embodiment of the disclosure, the cordless vacuum cleaner may further include a first charge terminal configured to charge the battery with a direct current (DC) voltage transmitted from the station. In an embodiment of the disclosure, the cordless vacuum cleaner may further include a temperature sensor installed within a certain distance from the first charge terminal and configured to detect a temperature of the first charge terminal, and at least one divider resistor configured to divide the voltage level of the DC voltage with the temperature sensor. In an embodiment of the disclosure, the cordless vacuum cleaner may further include a cleaner main body including a first processor configured to control performing a cleaning function through power of the battery and performing an overheating prevention operation based on a voltage level determined by the temperature sensor being greater than a certain threshold voltage level. In an embodiment of the disclosure, the cordless vacuum cleaner may further include a second charge terminal electrically connected to the first charge terminal to charge the battery of the cleaner main body. In an embodiment of the disclosure, the cordless vacuum cleaner may further include a station including a power conversion device connected to the second charge terminal and configured to generate the DC voltage to charge the battery.

According to an embodiment of the disclosure, a method of preventing overheating of a charge terminal in a cordless vacuum cleaner includes detecting a voltage level corresponding to the temperature of a charge terminal, by the temperature sensor that divides an input voltage with a divider resistor while a station is electrically connected to a cleaner main body through the charge terminal. In an embodiment of the disclosure, the method of preventing overheating of a charge terminal in a cordless vacuum cleaner may further include determining whether the charge terminal is overheated, by comparing the voltage level with a certain threshold voltage level. In an embodiment of the disclosure, the method of preventing overheating of a charge terminal in a cordless vacuum cleaner may further include performing at least one overheating prevention operation of an operation of separating the cleaner main body from the station, an operation of blocking, by a second switch, a connection from a power conversion device to the charge terminal in the station, and an operation of blocking a connection from the charge terminal to a battery by turning off a first switch in the cleaner main body.

DESCRIPTION OF DRAWINGS

FIG. 3B is a block diagram of a station according to an embodiment of the disclosure.

FIG. 13 is a flowchart of an overheating prevention operation according to an embodiment of the disclosure.

MODE FOR INVENTION

Figure 1A:
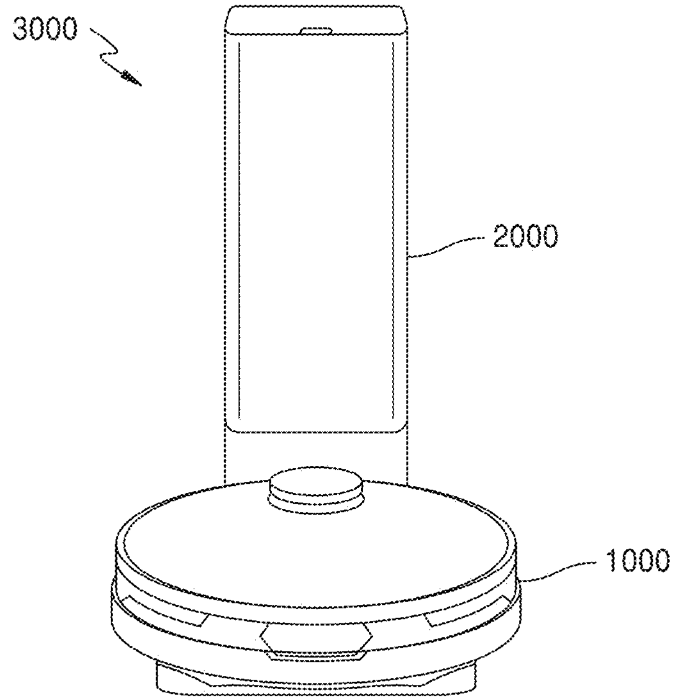
FIG. 1A illustrates a cordless vacuum cleaner in which a station is coupled to a cleaner main body, according to an embodiment of the disclosure.

Terms used in the disclosure are briefly described, and an embodiment of the disclosure is described in detail.

The terms used in the disclosure have been selected from currently widely used general terms in consideration of the functions in the disclosure. However, the terms may vary according to the intention of one of ordinary skill in the art, case precedents, and the advent of new technologies. In some aspects, for special cases, meanings of the terms selected by the applicant are described in detail in the description section. Accordingly, the terms used in the disclosure are defined based on their meanings in relation to the contents discussed throughout the specification, not by their simple meanings.

In the disclosure, expressions such as “at least one of a, b, or c” may denote “a”, “b”, “c”, “a and b”, “a and c”, “b and c”, “all of a, b, and c”, or modifications thereof.

It will be further understood that the terms “comprises” and/or “comprising” used herein specify the presence of stated features or components, but do not preclude the presence or addition of one or more other features or components. Furthermore, terms such as, for example, “ . . . portion,” “ . . . unit,” “ . . . module,” and “ . . . block” stated in the specification may signify a unit to process at least one function or operation and the unit may be embodied by hardware, software, or a combination of hardware and software.

The terms “about” or “approximately” as used herein are inclusive of the stated value and include a suitable range of deviation for the particular value as determined by one of ordinary skill in the art, considering the measurement in question and the error associated with measurement of the particular quantity. The term “about” can mean within one or more standard deviations, or within ±30%, 20%, 10%, 5% of the stated value, for example.

Embodiments of the disclosure are described with reference to the accompanying drawings such that one skilled in the art to which the disclosure pertains can easily work the disclosure. The disclosure may, however, be embodied in many different forms and should not be construed as being limited to the embodiments of the disclosure set forth herein. In the drawings, a part that is not related to a description is omitted to clearly describe the disclosure and, throughout the specification, similar parts are referenced with similar reference numerals.

Embodiments of the present disclosure support a method of detecting overheating of a charge terminal when overheating occurs in the charge terminal in a cordless vacuum cleaner and protecting the cordless vacuum cleaner from the overheating of the charge terminal, and embodiments of the present disclosure support a cordless vacuum cleaner adopting such a method. Furthermore, in some aspects, the method includes performing an operation to protect the cordless vacuum cleaner from the overheating of a charge terminal.

The technical objectives to be achieved by the disclosure are not limited to the above-described objectives, and other technical objectives that are not mentioned herein would be clearly understood by a person skilled in the art from the description of the disclosure.

FIG. 1A illustrates a cordless vacuum cleaner 3000 in which a station is coupled to a cleaner main body, according to an embodiment of the disclosure.

The cordless vacuum cleaner 3000 according to an embodiment of the disclosure may include a cleaner main body 1000 capable of autonomously moving and performing a cleaning function. The cordless vacuum cleaner 3000 may include a station 2000 coupled to the cleaner main body 1000 and including a power conversion device (2400) supportive of charging a battery of the cleaner main body 1000. The cleaner main body 1000 and the station 2000 may be electrically connected to each other through respective charge terminals of the cleaner main body 1000 and the station 2000. The cleaner main body 1000 may move in association with docking with the station 2000. In an example, in a docked state, the cleaner main body 1000 and the station 2000 may be electrically connected to each other through the charge terminals. According to an embodiment of the disclosure, the cordless vacuum cleaner 3000 may be a robot cleaner, but embodiments of the present disclosure are not limited thereto.

In some cases, when the cleaner main body 1000 is docked at the station 2000 such that charge terminals are electrically connected to each other, an electrical connection between the charge terminals may become unstable for some reasons, and the charge terminals may overheat. In an example in which the charge terminals are overheated, the charge terminal of the cordless vacuum cleaner 3000 may become damaged and damage to other components of the cordless vacuum cleaner 3000 may be caused, and moreover, fire may occur at the cordless vacuum cleaner 3000.

When docking (electrical connection) between the cleaner main body 1000 and the station 2000 is smoothly and appropriately made, a contact resistance between a charge terminal (hereinafter, referred to as the "main body charge terminal" or the "first charge terminal") at the side of the cleaner main body 1000 and a charge terminal (hereinafter, referred to as the "second charge terminal") at the side of the station 2000 may be considerably low. For example, the contact resistance may be below a certain resistance value. However, when the docking between the cleaner main body 1000 and the station 2000 is not smoothly performed due to various environmental factors such as, for example, a material of wood flooring or a material of a carpet or vinyl flooring, the location of the station 2000, an obstacle between the station 2000 and the cleaner main body 1000, disturbance by pets and kids, and the like, the environmental factors may prevent effective contact between the charge terminals of both sides. The contact error between the charge terminals of both sides causes a phenomenon that a contact resistance between the first charge terminal of the clean main body 1000 and the second charge terminal of the station 2000 increases (e.g., to an abnormally high contact resistance). In this case, during charging of the battery of the cleaner main body 1000, abnormally large contact resistance may generate heat, which may cause component damage or charge terminal damage at or around the charge terminal. In the disclosure, when simply referred to, the term "charge terminal" may collectively mean the first charge terminal of the cleaner main body 1000 or the second charge terminal of the station 2000, unless otherwise stated.

Embodiments of the present disclosure provide a method of detecting a temperature (heat) generated in the charge terminal during docking between the cleaner main body 1000 and the station 2000 and protecting the cordless vacuum cleaner 3000 when the temperature of the charge terminal is abnormally high. Embodiments of the present disclosure support the cordless vacuum cleaner 3000 adopting such a method.

When the cleaner main body 1000 is normally docked at the station 2000, and the cordless vacuum cleaner 3000 performs charging operations associated with charging the battery in the cleaner main body 1000, the station 2000 uses power (voltage*current) suitable for charging the battery according to the capacity of the power conversion device or a switched mode power supply (SMPS) as a power supply device (or a power supply circuit) for supplying power to the station 2000. In an example in which the cleaner main body 1000 is normally docked at the station 2000 and a charging operation starts, the contact resistance between the charge terminals is within several micro ohms (m (2), and thus, abnormal overheating does not particularly occur in the charge terminal during charging. However, when the cleaner main body 1000 is incompletely or incorrectly docked at the station 2000 for some reasons, the contact resistance of the charge terminal may increase to several ohms (52), and thus, power as much as P=I*I*R may be released as heat from the charge terminal.

For example, assuming that the specifications of the power conversion device of the station 2000 includes 25.25 V/2.5 A, for a case in which the contact resistance between the charge terminals is 5Ω because the cleaner main body 1000 is incompletely docked at the station 2000, power of 2.5*2.5*5=31 W of a total 63 W of battery charging power is converted into heat energy in the charge terminal, thereby causing overheating in the charge terminal. The overheating in the charge terminal may cause a temperature increase to 100° C. or more in moisture. In an example in which the overheating occurs, an injection mold encompassing the charge terminal, parts around the charge terminal, and/or the charge terminal itself may be deformed by heat, and fire in the cordless vacuum cleaner 3000 may follow.

Accordingly, embodiments of the present disclosure may include installing a temperature sensor capable of detecting a temperature in the charge terminal of the cleaner main body 1000 and/or the station 2000, which may support stable and safe charging having a high immunity against environmental factors within a consumer's home where the cordless vacuum cleaner 3000 is installed. Accordingly, for example, the cordless vacuum cleaner 3000 may be safely protected from overheating.

The cordless vacuum cleaner 3000 according to an embodiment of the disclosure may be a selectively usable cleaner of a hand type, an autonomous type, and a stick type. A hand type cleaner, an autonomous type cleaner, or/and a stick type cleaner according to an embodiment of the disclosure may be a cordless vacuum cleaner. The cleaner main body 1000 according to an embodiment of the disclosure is a portion held and moved by a user during cleaning. The cleaner main body 1000 may include a dust container (or a dust collecting container) for receiving foreign materials suctioned from a cleaning surface (e.g., floor such as, for example, wood floor, carpet, mat, or the like, bedding, sofa, or the like).

Figure 1B:
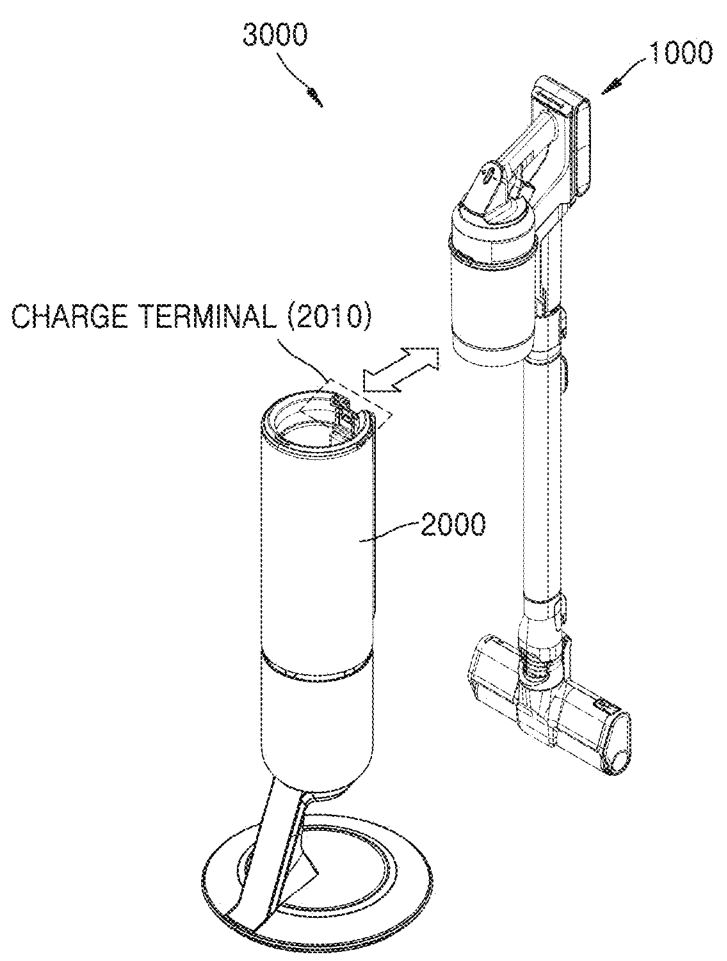
FIG. 1B illustrates a cordless vacuum cleaner in which a station is coupled to a cleaner main body, according to an embodiment of the disclosure.

FIG. 1B illustrates a cordless vacuum cleaner in which a station is coupled to a cleaner main body, according to an embodiment of the disclosure.

The cordless vacuum cleaner 3000 according to an embodiment of the disclosure may include the cleaner main body 1000 including a battery and in the form of a stick cleaner held directly by a user for cleaning. The cordless vacuum cleaner 3000 may include the station 2000 including the power conversion device to charge the battery of the cleaner main body 1000. The cleaner main body 1000 may be mounted on the station 2000 such that the cleaner main body 1000 and the station 2000 are electrically connected to each other through a second charge terminal 2010 at the side of the station 2000 viewed from FIG. 1B.

In some cases, the contact between the charge terminals may not smooth (e.g., due to environmental factors described herein) in the cordless vacuum cleaner 3000 in the form of the cleaner main body 1000 being mounted on the station 2000, as illustrated in FIG. 1B. Accordingly, when the contact between the charge terminals is not smooth, as illustrated above in FIG. 1A, heat may be generated and thus the charge terminal and/or component around the charge terminal may be damaged.

Figure 2A:
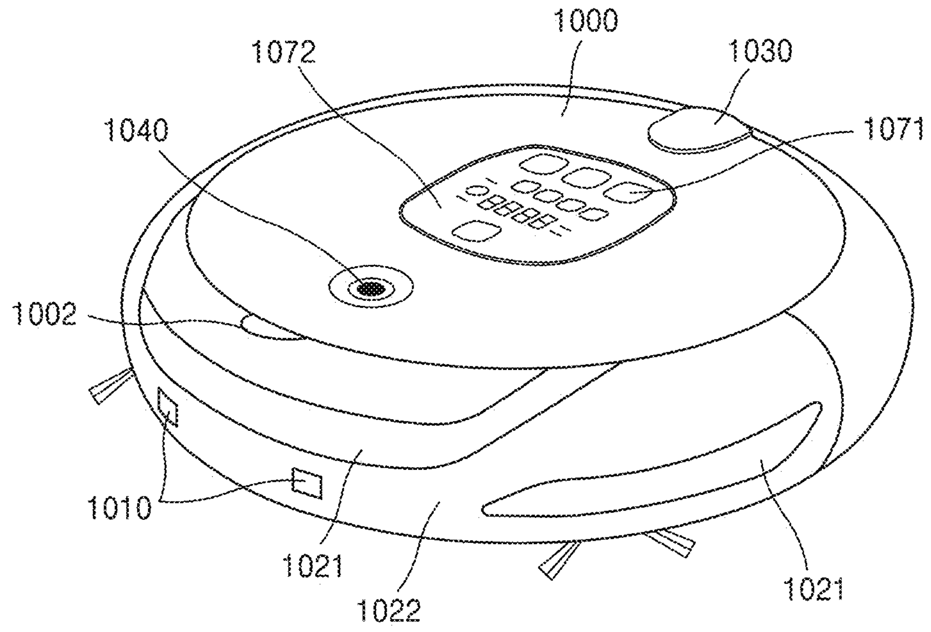
FIG. 2A is a view for explaining a structure of a surface of a robot cleaner according to according to an embodiment of the disclosure.

FIG. 2A is a view for explaining structure of a surface of a robot cleaner according to according to an embodiment of the disclosure.

Referring to FIG. 2A, illustrated is a perspective view of the cleaner main body 1000 of a robot cleaner among the cordless vacuum cleaner 3000 when viewed above in a diagonal direction. The cleaner main body 1000 may include a first charge terminal 1010, a first output interface 1072 as one of a first user interface 1070, a remote control receiver 1002, an obstacle sensor 1021, a bumper sensor 1022, a dust discharge hole 1030, a first input interface 1071 as one of the first user interface 1070, a camera 1040, and the like, but embodiments of the present disclosure are not limited thereto. Although not illustrated in FIG. 2A, the cleaner main body 1000 may further include a battery 1050 (e.g., internal to the cleaner main body 1000 or externally coupled to the cleaner main body 1000) for supplying power.

The first output interface 1073 may display a current state (e.g., cleaning, charging, overheating of a charge terminal, indicating the overheated charge terminal, indicating unavailability of battery charging due to low temperature, or the like), a battery level (e.g., remaining charge amount), a current cleaning mode (e.g., a quick mode, a precise mode, a carpet cleaning mode, or the like), and the like, but the display information is not limited thereto.

According to an embodiment of the disclosure, a user may change a cleaning mode (e.g., a quick mode or a precise mode) of the cleaner main body 1000 by using the first input interface 1071. Furthermore, a user may set a cleaning zone or a cleaning mode for a specific area by using the first input interface 1071.

Figure 2B:
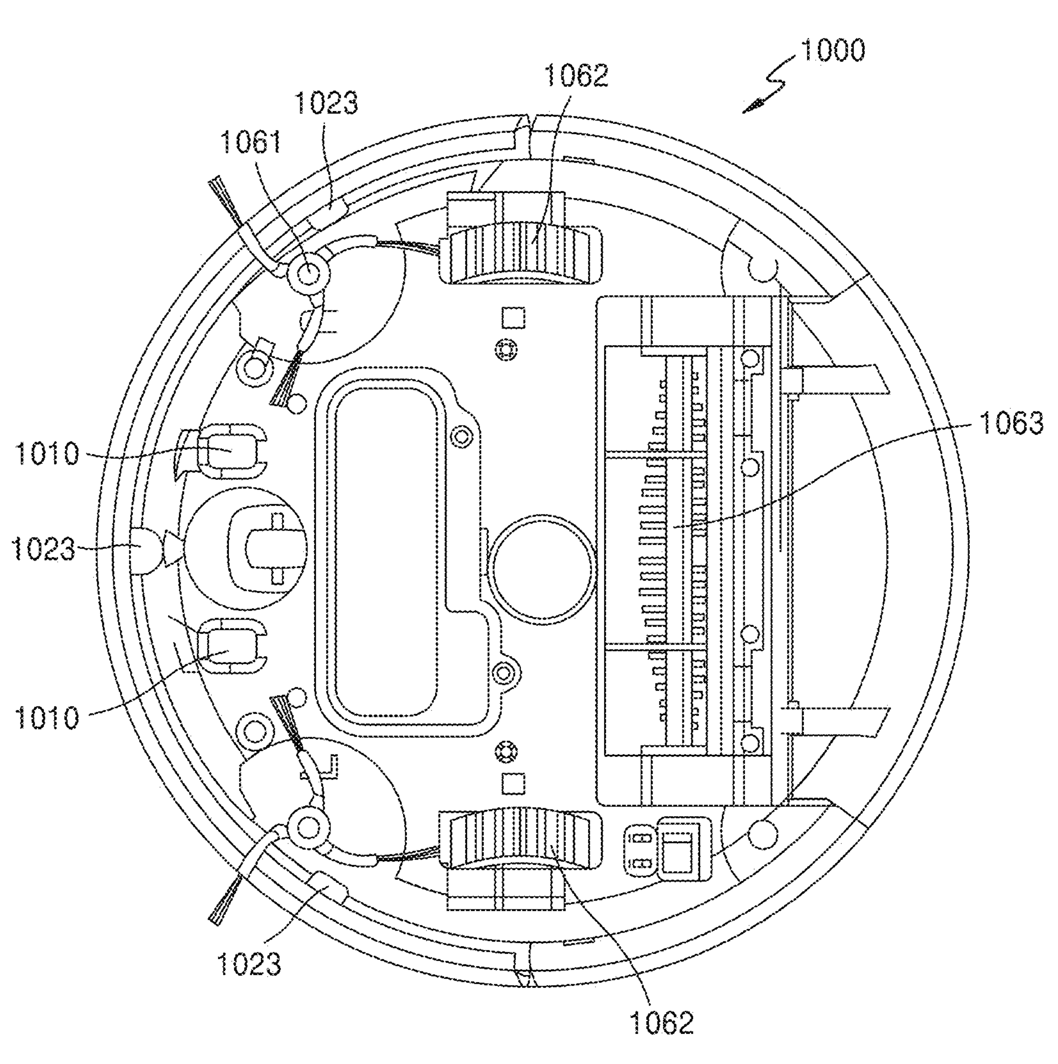
FIG. 2B is a view for explaining a lower surface structure of a robot cleaner according to an embodiment of the disclosure.

The first charge terminal 1010 may include a conductor for electric connection when connected to the station 2000. In FIG. 2A, although the first charge terminal 1010 according to an embodiment is attached to a side surface of the cleaner main body 1000, as illustrated in FIG. 2B, the first charge terminal 1010 may be attached to a bottom surface or other surface of the cleaner main body 1000. The location of the charge terminal 1010 may vary based on the design of the cordless vacuum cleaner 3000. In an example in which the first charge terminal 1010 is attached to the side surface of the cleaner main body 1000, the second charge terminal 2010 of the station 2000 may be installed on the side surface of the station 2000 in support of electrically connection to the first charge terminal 1010 of the cleaner main body 1000.

FIG. 2B is a view for explaining a lower surface structure of a robot cleaner according to an embodiment of the disclosure.

Referring to FIG. 2B, the cleaner main body 1000 of a robot cleaner may include the first charge terminal 1010, a fall prevention sensor 1023, a side rotation brush 1061, a driving wheel 1062, and a power brush 1063, but embodiments of the present disclosure are not limited thereto.

The first charge terminal 1010 is a terminal for electrical connection to the station 2000 when the cleaner main body 1000 is coupled to the station 2000. In FIG. 2B, unlike FIG. 2A, the first charge terminal 1010 may be installed on the bottom surface of the cleaner main body 1000. Accordingly, in the cleaner main body 1000 as illustrated in FIGS. 2A and 2B, the position of the first charge terminal 1010 may be the side surface and/or the bottom surface of the cleaner main body 1000, based on the design of the cordless vacuum cleaner 3000. In an example in which the first charge terminal 1010 is installed on the bottom surface as illustrated in FIG. 2B, the second charge terminal 2010 of the station 2000 is installed on the bottom surface facing upwards.

The fall prevention sensor 1023 is a sensor to prevent the cleaner main body 1000 from falling by detecting the cleaner main body 1000 of a robot cleaner reaching a position where the cleaner main body 1000 may fall during performing autonomous cleaning. The side rotation brush 1061 may be used to wipe out floor dust during cleaning as the cleaner main body 1000 autonomously moves. The driving wheel 1062 may be used to move when the cleaner main body 1000 moves to perform cleaning. The power brush 1063 may be used to suck-up dust while the cleaner main body 1000 autonomously moves and performs cleaning.

As the functions of the other components are those that a person skilled in the art can intuitively infer from the names thereof, detailed descriptions thereof are omitted.

Figure 3A:
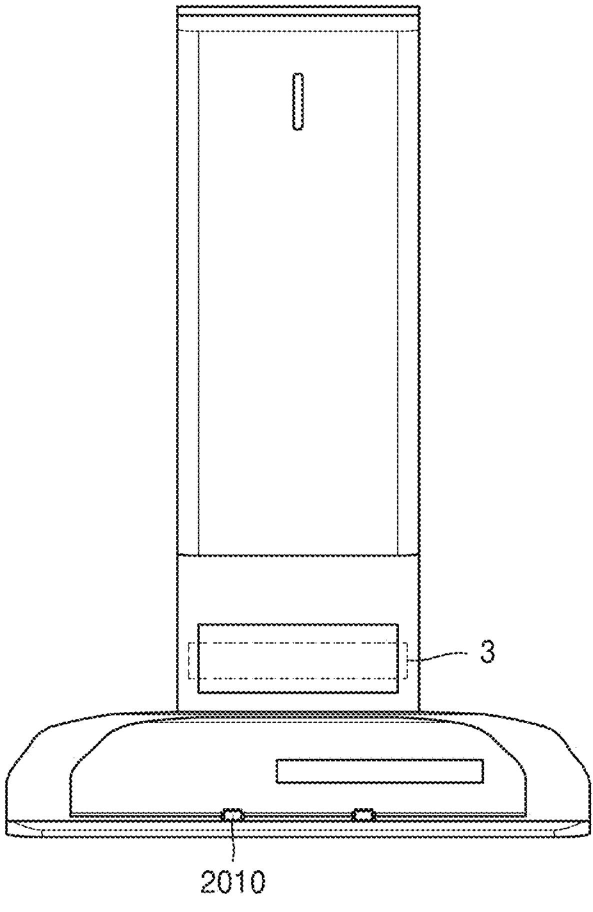
FIG. 3A is a view illustrating a station according to an embodiment of the disclosure.

FIG. 3A is a view illustrating the station 2000 according to an embodiment of the disclosure.

Referring to FIG. 3A, the station 2000 may include the second charge terminal 2010 to be docked with the cleaner main body 1000 and to charge the battery 1050 of the cleaner main body 1000 during docking. The second charge terminal 2010 may be located at a position suitable for establishing an electrical connection with the first charge terminal 1010 of the cleaner main body 1000. FIG. 3A illustrates that the second charge terminal 2010 may be located on the bottom surface. In an embodiment of the disclosure, when the first charge terminal 1010 of the cleaner main body 1000 is arranged on the side surface of the cleaner main body 1000, the second charge terminal 2010 may also be located on a side surface 3 of the station 2000.

Although not illustrated in FIG. 3A, according to an embodiment of the disclosure, the station 2000 may include therein a second temperature detection circuit 2100, a second processor 2200, a power conversion device 2400, a second switch 2410, a second communication interface 2300, a second user interface 2500, and a memory 2600, example aspects of which are later described with reference to FIG. 3B. The second switch 2410 may be a switch that may block or establish an electrical connection between the power conversion device 2400 and the second charge terminal 2010. The on/off of the second switch 2410 may be controlled by the second processor 2200. The configuration and functions of the station 2000 are described with reference to FIG. 3B.

FIG. 3B is a block diagram of the station 2000 according to an embodiment of the disclosure.

Referring to FIG. 3B, the station 2000 according to an embodiment of the disclosure may include the second temperature detection circuit 2100, the second processor 2200, the second communication interface 2300, the power conversion device 2400, the second switch 2410, the second user interface 2500, and the memory 2600. Throughout the specification, the second processor 2200 may be simply referred to as the "processor 2200", and the power conversion device 2400 may be referred to as SMPS. The processor 2200 may be a plurality of processors or a single processor.

The second temperature detection circuit 2100 is a circuit capable of detecting the temperature of the second charge terminal 2010. The second temperature detection circuit 2100 may include a divider resistor configured to divide a certain input voltage and a temperature sensor. The temperature sensor may be a thermistor having a resistance which varies according to temperature. The thermistor may include a positive temperature coefficient (PTC) thermistor or a negative temperature coefficient (NTC) thermistor, based on a circuit configuration. In the case in which a certain input voltage (DC voltage) is divided by the divider resistor and the temperature sensor, when the resistance of the temperature sensor changes according to a change in detected temperature, a voltage applied between the opposite ends of the temperature sensor changes. Then, the processor 2200 may receive the voltage change through an analog-digital conversion port and determine (e.g., based on the voltage change) the temperature of the second charge terminal 2010. In an example in which the processor 2200 does not include an analog-digital conversion portion, the processor 2200 may receive a value corresponding to the temperature of the second temperature detection circuit 2100 through an analog-digital conversion portion which is separate from the processor 2200.

The station 2000 may include the processor 2200. The processor 2200 may receive power through the power conversion device 2400 and control the overall operation of the station 2000. In an embodiment of the disclosure, the processor 2200 may determine the temperature of the second charge terminal 2010 through the second temperature detection circuit 2100, and when the second charge terminal 2010 is determined (e.g., by the processor 2200) to be overheated, the processor 2200 may protect the station 2000 from overheating by, for example, turning the second switch 2410 off. In an embodiment of the disclosure, when overheating occurs in the second charge terminal 2010, the processor 2200 may detect an overheating position, that is, in which one of two plus and minus (+ and −) terminals the overheating occurs, and the processor 2200 may control a second output interface 2510 of the station 2000 to output the overheating position by voice, display, or the like. For example, the processor 2200 may output a notification (e.g., a visual notification, an audio notification, a haptic notification, or the like) indicating the overheating position, via the second output interface 2510.

The processor 2200 of the station 2000 may include a single processor or a plurality of processors. The processor 2200 according to an embodiment of the disclosure may include at least one of a central processing unit (CPU), a graphics processing unit (GPU), an accelerated processing unit (APU), a many integrated core (MIC), a digital signal processor (DSP), and a neural processing unit (NPU). The processor 2200 may be implemented in the form of a system-on-chip (SoC) in which one or more electronic components are integrated. In an example in which the processor 2200 includes a plurality of processors, each processor may be implemented by separate hardware (H/W). The processor 2200 may be referred to as a microprocessor controller (MICOM), a microprocessor unit (MPU), or a micro controller unit (MCU). The processor 2200 according to an embodiment of the disclosure may be implemented by a single core processor or a multicore processor.

The station 2000 may include the second communication interface 2300, and the second communication interface 2300 may support communication between the station 2000 and an external device. For example, the station 2000 may communicate with the cleaner main body 1000 of the cordless vacuum cleaner 3000, a server (not illustrated), and/or a user terminal (not illustrated) through the second communication interface 2300. In this state, the second communication interface 2300 may communicate with the server through a first communication method (e.g., a Wi-Fi communication method) and with the cleaner main body 1000 through a second communication method (e.g., a Bluetooth low energy (BLE) communication method).

The second communication interface 2300 may include a short-range wireless communication interface 2310, a long-range wireless communication interface 2320, and the like. The short-range wireless communication interface 2310 may include a Bluetooth communication interface, a BLE communication interface, a near field communication interface (NFC), a wireless local-area network (WLAN) communication interface, a Zigbee communication interface, an infrared data association (IrDA) communication interface, a Wi-Fi direct (WFD) communication interface, an ultra-wideband (UWB) communication interface, an Ant+ communication interface, and the like, but embodiments of the present disclosure are not limited thereto. In some examples, the station 2000 may use the long-range wireless communication interface 2320 for remotely communicating with the server or the user terminal. The long-range wireless communication interface 2320 may include the Internet, a computer network (e.g., LAN or WAN), and a mobile communication interface. The mobile communication interface may include a 3G module, a 4G module, a 5G module, an LTE module, an NB-IoT module, an LTE-M module, and the like, but embodiments of the present disclosure are not limited thereto.

The second communication interface 2300 may transmit data to the processor 2200 through, for example, a universal asynchronous receiver/transmitter (UART) protocol that is an asynchronous communication, but the communication method is not limited thereto.

The second user interface 2500 of the station 2000 may include the second output interface 2510 and a second input interface 2520. The second input interface 2520 may be a device supportive of user input of a command to the cordless vacuum cleaner 3000. The second input interface 2520 may include a touch screen, a voice input device, a physical button, and the like, but embodiments of the present disclosure are not limited thereto. The second input interface 2520 may include a cleaning start operation button, a dust discharge button, a mode selection button, and the like. The second output interface 2510 may include a display, such as, for example, LED, LCD, a touch screen, and the like, or a voice output device, but embodiments of the present disclosure are not limited thereto. The second output interface 2510 may display a charge amount of the battery 1050 of the cleaner main body 1000, software update progress information, operation event information, overheating information of the cordless vacuum cleaner 3000, whether the second charge terminal 2010 and/or the first charge terminal 1010 is overheated, whether any charge terminal is overheated, and the like, but embodiments of the present disclosure are not limited thereto.

The memory 2600 of the station 2000 may store a program (e.g., one or more instructions) for the processor 2200 to control the overall operation of the cordless vacuum cleaner 3000 or the station 2000, or pieces of data that are input/output. For example, the memory 2600 of the station 2000 may include software relate to the control of the station 2000, charge terminal overheating state data, charge terminal overheating history data, charge terminal overheating position information data, error occurrence data (failure history data), a type of an operation event, information about charging of the battery 1050, for example, charging intervals, recent compensation charging time point data, a charging level of the battery 1050 during recent compensation charging, and the like, but embodiments of the present disclosure are not limited thereto. The memory 2600 of the station 2000 may store data received from the cleaner main body 1000. For example, the memory 2600 may store product information of the cordless vacuum cleaner 3000 mounted on the station 2000 (e.g., identification information, model information, or the like), version information of software installed on the cordless vacuum cleaner 3000, error occurrence data (failure history data) of the cordless vacuum cleaner 3000, temperature data of the station 2000 or the cleaner main body 1000, information related to charging of the battery 1050, charge terminal overheating notification received from the cleaner main body 1000 (including information about in which one of a plus (+) terminal and a minus (−) terminal overheating occurs), and the like.

The memory 2600 may include a storage medium of at least one type of memory (e.g., SD or XD memory, or the like) of a flash memory type, a hard disk type, a multimedia card micro type, and a card type, random access memory (RAM), static random access memory (SRAM), read-only memory (ROM), electrically erasable programmable ROM (EEPROM), programmable ROM (PROM), magnetic memory, a magnetic disk, and an optical disc. Programs stored in the memory 2600 may be classified into a plurality of modules according to functions thereof.

The power conversion device 2400 is a device capable of converting received AC input power into DC power. The power conversion device 2400 may include an integrated circuit (IC) for power conversion, such as, for example, a pulse width modulation (PWM) controller, for power conversion. In an example in which the cleaner main body 1000 is electrically connected to the station 2000, DC power generated by the power conversion device 2400 is supplied to the battery 1050 of the cleaner main body 1000 through the second charge terminal 2010 of the station 2000 and the first charge terminal 1010 of the cleaner main body 1000, thereby charging the battery 1050. The second charge terminal 2010 is electrically connected to the first charge terminal 1010 and is used to charge the battery 1050 included in the cleaner main body 1000. The second charge terminal 2010 may be connected to the power conversion device 2400 and may provide an electrical connection to charge the battery 1050 by connecting the DC voltage (e.g., 30 V) output from the power conversion device 2400 to the battery 1050 through the first charge terminal 1010.

The cordless vacuum cleaner 3000 according to an embodiment of the disclosure is not limited to an autonomous type cleaner such as, for example, a robot cleaner, and the cleaner main body 1000 may be of a stick type cleaner.

In some cases, some components illustrated in FIG. 3B may be non-essential components. In some embodiments, the station 2000 may be implemented by more or less components than the components illustrated in FIG. 3B.

Figure 4A:
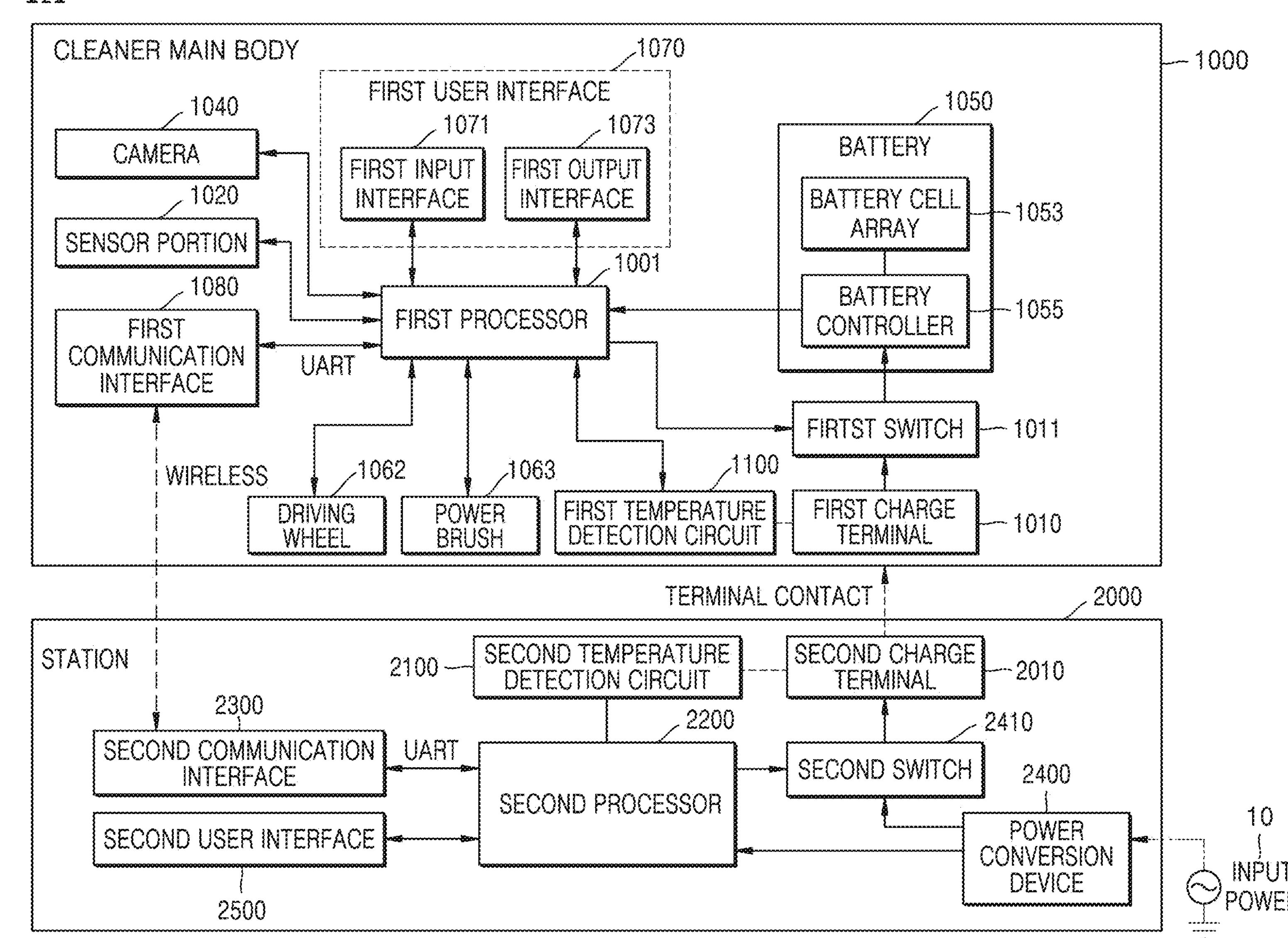
FIG. 4A is a block diagram of a cordless vacuum cleaner according to an embodiment of the disclosure.

FIG. 4A is a block diagram of the cordless vacuum cleaner 3000 according to an embodiment of the disclosure.

Referring to FIG. 4A, the cordless vacuum cleaner 3000 may include the station 2000 and the cleaner main body 1000. The station 2000 and the cleaner main body 1000 may be electrically connected through the first and second charge terminals 1010 and 2010. The station 2000 may be directly connected to an input power 10. The power conversion device 2400 of the station 2000 may generate a DC voltage to charge the battery 1050 in the cleaner main body 1000. The power conversion device 2400 of the station 2000 may be electrically connected to the cleaner main body 1000 via the second charge terminal 2010. In an embodiment of the disclosure, the second switch 2410 that may block the DC voltage generated from the power conversion device 2400 may be included between the power conversion device 2400 and the second charge terminal 2010, but embodiments of the present disclosure are not limited thereto. In some examples, the second switch 2410 may be omitted from between the power conversion device 2400 and the second charge terminal 2010. The cleaner main body 1000 may include the first charge terminal 1010 electrically connected to the second charge terminal 2010. The battery 1050 may be charged by the DC voltage transmitted through the first charge terminal 1010. In an embodiment of the disclosure, a first switch 1011 capable of blocking power (e.g., blocking the transfer of power between the power conversion device 2400 and the battery 1050) may be included between the first charge terminal 1010 and the battery 1050, but embodiments of the present disclosure are not limited thereto. In some examples, the first switch 1011 may be omitted.

The battery 1050 may supply power to the cleaner main body 1000 such that the cleaner main body 1000 may be detached from the station 2000 and wirelessly used without a power cord. The battery 1050 may be charged to, for example, a certain DC voltage (e.g., 30 V) through the power conversion device 2400. However, the charging voltage is not limited thereto, and the amount of charging voltage (or driving DC voltage) may vary based on the specifications of the battery 1050.

The power conversion device 2400 may receive the input power 10 supplied to the station 2000 and convert the AC voltage (AC) into a DC voltage (DC). The power conversion device 2400 may include a switching element for AC voltage (AC)-DC voltage (DC) conversion and a PWM controller for driving the switching element. The switching element of the power conversion device 2400 may employ any one of a field effect transistor (FET), a metal oxide field effect transistor (MOSFET), an insulated gate bipolar mode transistor (IGBT), and a transistor (TR), but embodiments of the present disclosure are not limited thereto. The power conversion device 2400 may be located on the bottom surface of the station 2000 to be connected to the input power 10, but embodiments of the present disclosure are not limited thereto, and power conversion device 2400 may be located on any surface of the station 2000.

The cleaner main body 1000 and the station 2000 may be electrically connected to each other through the first charge terminal 1010 and the second charge terminal 2010. The cleaner main body 1000 may include a first processor 1001, the first charge terminal 1010, a sensor portion 1020, the camera 1040, the battery 1050, the driving wheel 1062, the power brush 1063, the first user interface 1070, a first communication interface 1080, and a first temperature detection circuit 1100. However, this is an example that the cleaner main body 1000 is a robot cleaner, and when the cleaner main body 1000 is a stick cleaner, components, such as, for example, the camera 1040, the sensor portion 1020, the driving wheel 1062, and the power brush 1063, may be omitted from the cleaner main body 1000. In an example in which the cordless vacuum cleaner 3000 is a stick cleaner, the cleaner main body 1000 may include a suction motor.

The first processor 1001 may handle the overall control of the cleaner main body 1000. The first processor 1001 may be referred to as a main body processor 1001 in the disclosure. The first processor 1001 may include therein an analog-digital conversion portion according to an embodiment of the disclosure. Although it is not illustrated in FIG. 4A, when the first processor 1001 does not include an analog-digital conversion portion, the cleaner main body 1000 may include a separate analog digital conversion IC. The first processor 1001, when including an analog-digital conversion portion therein, may include an analog-digital conversion input port for receiving an analog signal and converting the analog signal into a digital signal. In an embodiment of the disclosure, the analog-digital conversion input port may include a plurality of analog-digital conversion input ports. The analog-digital conversion input port may for example, receive an analog value corresponding to a voltage varying in real time from the first temperature detection circuit 1100. The received analog value may be converted into a digital value that the first processor 1001 may process. The first processor 1001 may determine whether the first charge terminal 1010 is overheated, by converting the analog value corresponding to a change in voltage transmitted from the first temperature detection circuit 1100 into a digital value and then comparing the digital value with a certain threshold value corresponding to a temperature value that is determined to be overheated. In an embodiment of the disclosure, the certain threshold value may correspond to a certain threshold voltage level by which the first charge terminal 1010 may be determined to be overheated.

The first processor 1001, when the first charge terminal 1010 is determined (e.g., by the first processor 1001) to be overheated, may perform a certain overheating prevention operation. The certain overheating prevention operation is described with reference to FIG. 12A.

Figure 12A:
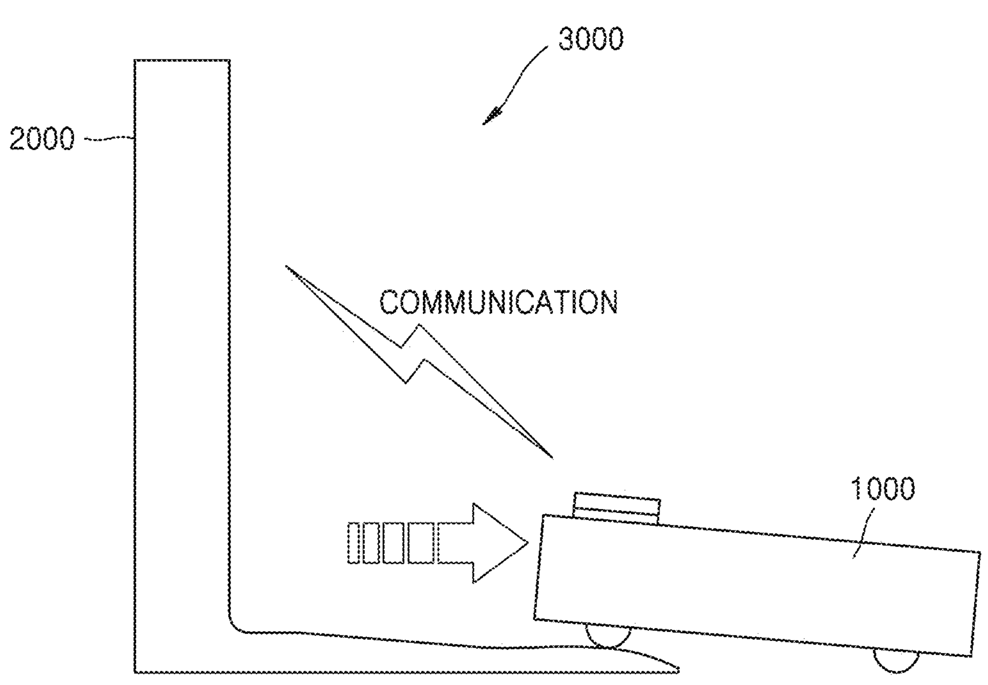
FIG. 12A illustrates an overheating prevention operation supportive of separating a cleaner main body from a station for preventing overheating, according to an embodiment of the disclosure.

FIG. 12A illustrates an overheating prevention operation supportive of separating the cleaner main body 1000 from the station 2000 for preventing overheating, according to an embodiment of the disclosure.

Referring to FIG. 12A, in an embodiment of the disclosure, when the first processor 1001 of the cleaner main body 1000 determines that the first charge terminal 1010 is overheated, the first processor 1001 may perform an overheating prevention operation of separating the cleaner main body 1000 from the station 2000 by a certain distance or more by driving the cleaner main body 1000. For example, the first processor 1001 may control and move the cleaner main body 1000 such that the cleaner main body 1000 is spaced apart from the station 2000 by at least the certain distance. In an example, a distance by which the first charge terminal 1010 may be electrically insulated from the second charge terminal 2010 of the station 2000 is sufficient as the certain distance. In an example in which the station 2000 detects overheating in the second charge terminal 2010, the station 2000 may transmit an overheating notification to the cleaner main body 1000 through communication with the cleaner main body 1000. The cleaner main body 1000 may perform an overheating prevention operation by driving the cleaner main body 1000 based on the received overheating notification. In an example, the overheating prevention operation may include controlling the cleaner main body 1000 such that the cleaner main body 1000 is spaced apart from the station 2000 by a certain distance or more.

Figure 12B:
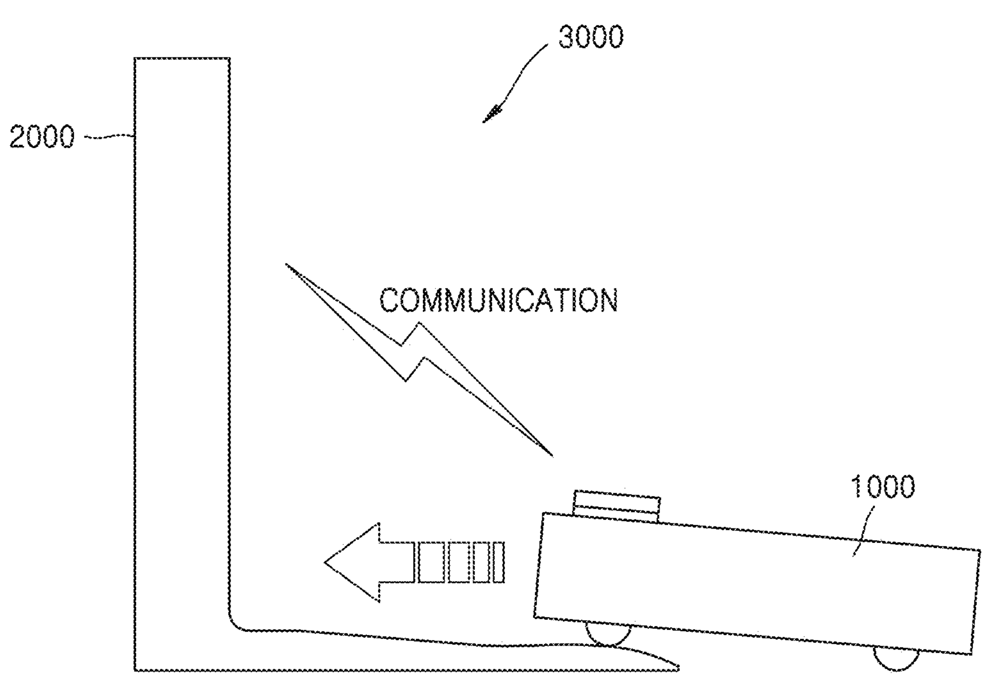
FIG. 12B illustrates that a cleaner main body is recoupled to a station as overheating is released, according to an embodiment of the disclosure.

FIG. 12B illustrates that the cleaner main body 1000 is recoupled to the station 2000 as overheating is released, according to an embodiment of the disclosure.

According to an embodiment of the disclosure, after the first processor 1001 controls the cleaner main body 1000 based on the overheating determination or the received overheating notification such that the cleaner main body 1000 is separated from the station 2000 by a certain distance or more, the first processor 1001 may determine whether the temperature of the first charge terminal 1010 is determined to have decreased to a certain temperature or lower. In an example, when the first processor 1001 determines the temperature of the first charge terminal 1010 has decreased to a certain temperature or lower, the first processor 1001 may control the cleaner main body 1000 to perform a docking operation, that is, an overheating release operation, to electrically reconnect the cleaner main body 1000 to the station 2000. In this state, the first processor 1001 may perform an overheating release operation based on determining the temperature of the first charge terminal 1010 has decreased to a certain temperature or lower. Additionally, or alternatively, the first processor 1001 may perform the overheating release operation based on receiving a notification from the station 2000, in which the notification indicates that the temperature of the second charge terminal 2010 is decreased to a certain temperature or lower. In an embodiment of the disclosure, the certain temperature may be 50° C., but is not limited thereto. For example, when the first processor 1001 determines that the temperature at the first charge terminal 1010 is has decreased to 50° C. or lower, the first processor 1001 may perform an overheating release operation.

Another overheating prevention operation is described with reference back to FIG. 4A.

The overheating prevention operation of the first processor 1001 may be performed by another method. According to an embodiment of the disclosure, when the first charge terminal 1010 is determined to be overheated, the first processor 1001 may control the first switch 1011 (turn off the first switch 1011) such that the electrical connection between the first charge terminal 1010 and the battery 1050 is blocked. Descriptions herein of a switch (e.g., first switch 1011, second switch 2410) which is turned off may refer to a state in which an electrical connection between the switch and another component is blocked, and descriptions herein of a switch (e.g., first switch 1011, second switch 2410) which is turned on may refer to a state in which an electrical connection between the switch and another component is established. In some aspects, descriptions herein of a switch (e.g., first switch 1011, second switch 2410) which is turned off may refer to an open state in which the switch is preventing the flow of electrical current or power, and descriptions herein of a switch (e.g., first switch 1011, second switch 2410) which is turned on may refer to a closed state in which the switch is enabling the flow of electrical current or power.

Through the operation of controlling the first switch 1011, the component damage of the cordless vacuum cleaner 3000 due to the overheating of the first charge terminal 1010 (or the second charge terminal 2010 of the station 2000) may be prevented by blocking the electrical connection between the power conversion device 2400 of the station 2000 and the battery 1050 of the cleaner main body 1000. Throughout the disclosure, the first charge terminal 1010 being overheated may be understood as the second charge terminal 2010 of the station 2000 being overheated. This is because, at the time when overheating occurs, the first charge terminal 1010 and the second charge terminal 2010 may be in a considerably close contact with each other. Alternatively, even when the second charge terminal 2010 and the first charge terminal 1010 are connected to each other, there may be a difference in the temperature detected in each charge terminal due to a fine separation, and overheating of the first charge terminal 1010 and overheating of the second charge terminal 2010 of the station 2000 may be separately distinguished.

The overheating prevention operation of the first processor 1001 may be performed by another method. According to an embodiment of the disclosure, when the first charge terminal 1010 is determined to be overheated, the first processor 1001 may communicate with the second communication interface 2300 of the station 2000 through the first communication interface 1080 and notify the station 2000 that the first charge terminal 1010 (or, the second charge terminal 2010 of the station 2000 in contact with the first charge terminal 1010) is in an overheating state (an overheating notification). For example, the cleaner main body 1000 may provide an overheating notification to the station 2000.

In an embodiment of the disclosure, the station 2000 having received the overheating notification from the cleaner main body 1000 may perform an appropriate overheating prevention operation based on the received overheating notification. The overheating notification is a notification indicating that the first charge terminal 1010 is overheating. In an embodiment of the disclosure, the second processor 2200 of the station 2000 may turn the second switch 2410 of the station 2000 off based on the received overheating notification received from the cleaner main body 1000 so as to block the electrical connection between the power conversion device 2400 and the second charge terminal 2010.

In an embodiment of the disclosure, reversely, the first processor 1001 may receive an overheating notification from the station 2000 and perform an overheating prevention operation. The overheating prevention operation refers to an operation to prevent the first charge terminal 1010 and/or the second charge terminal 2010 from being overheated.

In an embodiment of the disclosure, when receiving the overheating notification from the station 2000, the first processor 1001 may control the driving wheel 1062 to perform an overheating prevention operation which includes separating the cleaner main body 1000 from the station 2000 by a certain distance.

In an embodiment of the disclosure, when receiving the overheating notification from the station 2000, the first processor 1001 may perform an operation of turning the first switch 1011 off, blocking the electrical connection between the second charge terminal 2010 and the battery 1050. The overheating prevention operations described herein may be performed independently of one another or in combination.

For an example case in which the cordless vacuum cleaner 3000 is a robot cleaner, the sensor portion 1020 senses a movement space to prevent the cleaner main body 1000 from falling into a cleaning disability state due to an obstacle or fall while moving in a cleaning target space. The sensor portion 1020 may include the obstacle sensor 1021, the bumper sensor 1022, and the fall prevention sensor 1023, but embodiments of the present disclosure are not limited thereto. Furthermore, when the cordless vacuum cleaner 3000 is a stick type cleaner, the cordless vacuum cleaner 3000 may omit the sensor portion 1020.

The first temperature detection circuit 1100 is a circuit for detecting overheating of the first charge terminal 1010 and may be referred to as a main body temperature detection circuit. The first temperature detection circuit 1100 may be a circuit having the same configuration as the second temperature detection circuit 2100 of the station 2000. Accordingly, both of the first and second temperature detection circuits 1100 and 2100 may be simply referred to as the temperature detection circuit. The first temperature detection circuit 1100 may include a divider resistor to divide a certain input voltage and the temperature sensor.

The temperature sensor may be a thermistor with a resistance varying according to the temperature. Accordingly, throughout the disclosure, the temperature sensor and the thermistor may be interchangeably used. The thermistor may include a PTC thermistor or a NTC thermistor, based on a circuit configuration. In the case in which a certain input voltage is divided by the divider resistor and the temperature sensor, when the resistance of the temperature sensor changes according to a change in detected temperature, a voltage applied between the opposite ends of the temperature sensor changes. Then, the processor 1001 may receive the voltage change through an analog-digital conversion port and determine the temperature of the first charge terminal 1010.

The first temperature detection circuit 1100 may detect whether the first charge terminal 1010 is in an excessively low temperature state. In an embodiment of the disclosure, the first processor 1001 may compare the temperature determined by the divider resistor at the main body side and the temperature sensor of the first temperature detection circuit 1100 with a certain second threshold temperature. For example, the second threshold temperature may be a considerably low temperature, for example, 0° C. The first processor 1001 may determine that the temperature detected in the first charge terminal 1010 is a temperature that is not sufficient for charging the battery 1050 (e.g., the temperature does not support charging of the battery 1050), according to a result of the comparison. The first processor 1001 may notify the station 2000 (e.g., transmit a low temperature notification to the station 2000) that the first charge terminal 1010 is not in a state to charge the battery 1050 through the first communication interface 1080, based on the determination that the temperature detected at the first charge terminal 1010 is a temperature that is too low to charge the battery 1050, compared with a certain second threshold voltage level. In an embodiment of the disclosure, the station 2000 having received the low temperature notification may output, by voice, display, or the like, a message indicating that the first charge terminal 1010 is not in a state to charge the battery 1050, through the second user interface 2500.

The battery 1050 may be referred to as a battery pack and may include a battery cell array 1053 charged with electricity and a battery controller 1055 configured to control the battery 1050.

The first user interface 1070 may include the first input interface 1071 configured to input a command to the cordless vacuum cleaner 3000 and the first output interface 1073 through which the cordless vacuum cleaner 3000 displays information to a user. The first input interface 1071 may be a user input interface capable of touch recognition. The first output interface 1073 may be an LCD or LED display, but embodiments of the present disclosure are not limited thereto. The first output interface 1073 may display various pieces of information illustrating the state of the cordless vacuum cleaner 3000 to a user. As an example, the first output interface 1073 may display whether a charge terminal is overheated when the first charge terminal 1010 and/or the second charge terminal 2010 of the cordless vacuum cleaner 3000 is overheated, and the first output interface 1073 may also display position information about in which one of the plus (+) charge terminal and the (−) charge terminal overheating occurs, in the cordless vacuum cleaner 3000 according to an embodiment of the disclosure. Furthermore, the first output interface 1073 may display an operation state or a charge amount of the cordless vacuum cleaner 3000 or provide information about charging or not and the like of the cordless vacuum cleaner 3000.

The first communication interface 1080 may transceive data under the control of the first processor 1001 and perform a wireless communication with the second communication interface 2300 of the station 2000. The first processor 1001 may notify the station 2000 that the first charge terminal 1010 is overheated, through the first communication interface 1080. The first processor 1001 may receive from the station 2000 an overheating notification indicating that the second charge terminal 2010 of the station 2000 is overheated, through the first communication interface 1080.

The station 2000 may include the processor 2200, the second communication interface 2300, and the second user interface 2500. The station 2000 may perform mainly an auto/manual dust empty operation, a communication operation with the cleaner main body 1000 through a communication connection (WiFi or BLE), and an operation of charging the battery 1050 mounted in the cleaner main body 1000. The power conversion device 2400 of the station 2000 may receive an AC voltage from the input power 10 and generate a desired DC voltage by PWM switching of a switching element such as, for example, a FET under the control of the PWM controller therein. As an example, to charge the battery 1050 of the cleaner main body 1000, the power conversion device 2400 may generate a DC voltage of 30 V. Furthermore, as applicable, the power conversion device 2400 may generate a DC voltage of 5 V or 3.3 V in association with operating the second processor 2200 of the station 2000 and the first processor 1001 of the cleaner main body 1000.

The processor 2200 may determine whether the second charge terminal 2010 is overheated, by using the second temperature detection circuit 2100. The processor 2200 may include an analog-digital conversion portion according to an embodiment of the disclosure, and although it is not illustrated in FIG. 4A, when the processor 2200 does not include an analog-digital conversion portion, the station 2000 may include a separate analog-digital conversion IC. In an example in which the station 2000 includes a separate analog-digital conversion IC, the processor 2200 may be connected to the analog-digital conversion IC and may receive digitally converted data from the analog-digital conversion IC. For example, the processor 2200 may receive data on the temperature of the second charge terminal 2010 detected by the second temperature detection circuit 2100 through the analog-digital conversion IC.

In an embodiment of the disclosure, when the processor 2200 includes an analog-digital conversion portion, the processor 2200 may include an analog-digital conversion input port to receive an analog signal to be converted into a digital signal. The analog-digital conversion input port may include a plurality of analog-digital conversion input ports. The analog-digital conversion input port may receive, for example, an analog value corresponding to a temperature change, or a voltage change, from the second temperature detection circuit 2100. The received analog value may be converted into a digital signal to be processable by the processor 2200. The processor 2200 may convert the analog value corresponding to the temperature change, or the voltage change, received from the second temperature detection circuit 2100 into a digital value and then compare the digital value with a certain threshold value, thereby determining whether the second charge terminal 2010 is overheated. In an embodiment of the disclosure, the certain threshold value may correspond to a certain threshold temperature level, or a certain threshold voltage level, at which the second charge terminal 2010 is determined to be overheated.

When the second charge terminal 2010 is determined to be overheated, the processor 2200 may perform a certain overheating prevention operation. In an embodiment of the disclosure, when the second charge terminal 2010 is determined to be overheated, the processor 2200 may transmit an overheating notification to the cleaner main body 1000 through the second communication interface 2300 so as to perform an overheating prevention operation in association with separating the cleaner main body 1000 from the station 2000 by a certain distance or more. For example, a distance by which the second charge terminal 2010 may be electrically insulated from the first charge terminal 1010 of the cleaner main body 1000 is sufficient as the certain distance.

After the cleaner main body 1000 is separated from the station 2000 by a certain distance or more, when it is determined that the second charge terminal 2010 is decreased to a certain temperature or lower, the processor 2200 may transmit an overheating release notification to the cleaner main body 1000 through the second communication interface 2300 such that the cleaner main body 1000 performs a docking operation to be electrically reconnected to the station 2000.

The overheating prevention operation of the processor 2200 may be performed by another method. According to an embodiment of the disclosure, when the second charge terminal 2010 is determined to be overheated, the processor 2200 may control the second switch 2410 (turn off the second switch 2410) so as to block the connection between the second charge terminal 2010 and the power conversion device 2400. Through this operation, the electrical connection between the power conversion device 2400 of the station 2000 and the battery 1050 of the cleaner main body 1000 is blocked, and thus, component damage or fire of the cordless vacuum cleaner 3000 due to the overheating of the second charge terminal 2010 may be prevented.

The overheating prevention operation of the processor 2200 may be performed by another method. According to an embodiment of the disclosure, when the second charge terminal 2010 is determined to be overheated, the processor 2200 may communicate with the first communication interface 1080 of the cleaner main body 1000 through the second communication interface 2300 and notify the cleaner main body 1000 (e.g., provide an overheating notification) that the second charge terminal 2010 (or the first charge terminal 1010) is in an overheating state.

The cleaner main body 1000 having received the overheating notification from the processor 2200 may perform an appropriate overheating prevention operation based on the received overheating notification. The overheating notification is a notification indicating that the first and second charge terminals 1010 and 2010 are overheating. In an embodiment of the disclosure, the first processor 1001 of the cleaner main body 1000 may turn off the first switch 1011 of the cleaner main body 1000 based on the overheating notification received from the station 2000 so as to block the electrical connection between the first charge terminal 1010 and the battery 1050.

In an embodiment of the disclosure, when overheating occurs in the second charge terminal 2010, the processor 2200 may perform the overheating prevention operation to turn off the second switch 2410 and also transmit an overheating notification (a notification for separation) to the cleaner main body 1000, as an additional overheating prevention operation, in association with separating the cleaner main body 1000 and the station 2000.

The second communication interface 2300 of the station 2000 may perform communication with the first communication interface 1080 of the cleaner main body 1000 and exchange data with the cleaner main body 1000. The second communication interface 2300 may be connected to the processor 2200 by an asynchronous communication (e.g., UART) protocol and may transmit the received data to the processor 2200 or receive data to be transmitted from the processor 2200 and transmit the received data.

The second user interface 2500 of the station 2000 may display various pieces of information illustrating the state of the cordless vacuum cleaner 3000 to a user. As an example, when the second charge terminal 2010 of the cordless vacuum cleaner 3000 is overheated, the second user interface 2500 may display through a display whether there is overheating, and the second user interface 2500 may display position information about in which part (+, −) of the charge terminal of the cordless vacuum cleaner 3000 is overheating, according to an embodiment of the disclosure. Furthermore, the second user interface 2500 may display an operation state or a charge amount of the cordless vacuum cleaner 3000 or provide information about charging or not and the like of the cordless vacuum cleaner 3000.

Figure 4B:
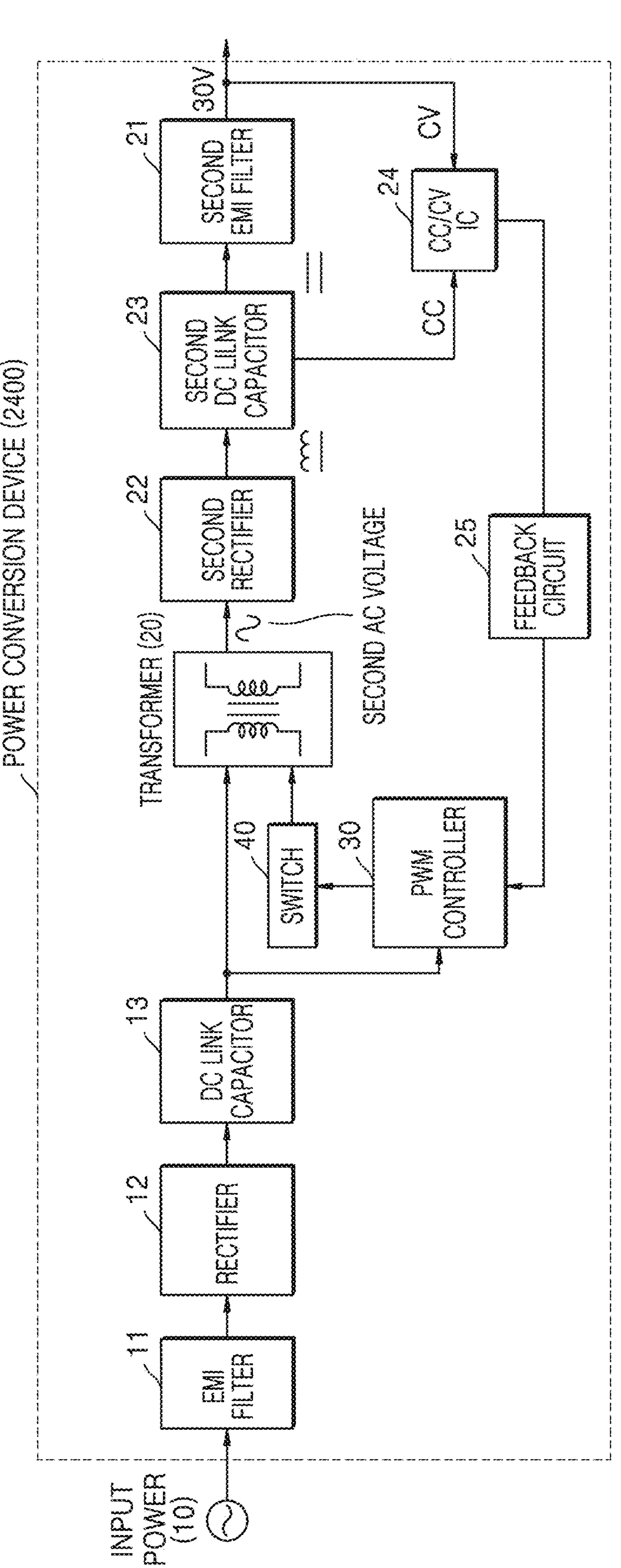
FIG. 4B is a block diagram of a power conversion device according to an embodiment of the disclosure.

FIG. 4B is a block diagram of the power conversion device 2400 according to an embodiment of the disclosure.

Referring to FIG. 4B, the power conversion device 2400 may receive the input power 10 that is an AC voltage. Although varying based on the specifications, the amount of AC voltage may be an amount ranging from 90 V to 210 V. However, since there are countries that use AC voltage values lower or higher than the above values, the above values are example approximate values and are not intended to limit the size range of AC voltage.

The power conversion device 2400 is a power conversion device to convert the AC voltage received through the input power 10 into a DC voltage (e.g., DC 5 V and/or DC 30 V) suitable for powering the cleaner main body 1000 or the station 2000.

Noise in the AC voltage received from the input power 10 is removed through an EMI filter 11, and the AC voltage removed of noise is converted to a DC voltage through a rectifier 12. The rectifier 12 is configured mainly with a diode, but the rectifier 12 is not limited thereto and may be configured with a switching element, such as, for example, a thyristor or an insulated gate bipolar mode transistor (IGBT). The DC voltage converted by the rectifier 12 is smoothed by a DC link capacitor 13. The DC voltage at opposite ends of the DC link capacitor 13 may be converted again into an AC voltage of a desired size and a desired frequency, through the PWM switching by a switch 40 under the control of a PWM controller 30. The converted AC voltage may pass through a transformer 20 for insulation, filtering, and/or voltage size change. A second side output of the transformer 20 becomes a second AC voltage, and the second AC voltage passes through a second rectifier 22 to be rectified again into a second DC voltage. The second DC voltage is smoothed by a second DC link capacitor 23. The smoothed second DC voltage passes through a second EMI filter 21 for noise removal, and the DC voltage (e.g., DC 30 V) having passed through the second EMI filter 21 passes through the first and second charge terminals 1010 and 2010 to be used for charging the battery 1050 of the cleaner main body 1000.

In FIG. 4B, a constant current (CC)/constant voltage (CV) IC 24 is a circuit or IC that controls conversion to a CC mode or a CV mode during charging of the battery 1050. In an example in which an amount of discharge increases, the voltage of the battery 1050 may decrease lower than a buffer voltage (e.g., 30 V). Accordingly, in charging the battery 1050, charging is performed in a CC mode under the control of the CC/CV IC 24 to a time point of a certain percent (%) compared with a buffer (e.g., 80% compared with a buffer), and then, the battery 1050 is charged in a CV mode. The conversion to the CC mode or CV mode is managed by the CC/CV IC 24.

A feedback circuit 25 may monitor am output end (30 V) to charge the battery 1050 and provide a feedback to the PWM controller 30 such that a charging output to the battery 1050 is constant. In an example in which a charging voltage to the battery 1050 is 30 V, if a current charging voltage is 32V, the feedback circuit 25 provides an overvoltage feedback to the PWM controller 30. The PWM controller 30 having received the overvoltage feedback controls the output voltage of the power conversion device 2400 to be low by reducing the switching of the switch 40. Reversely when the charging voltage to the battery 1050 is currently 27 V, the feedback circuit 25 provides a low voltage feedback to the PWM controller 30. The PWM controller 30 having received the low voltage feedback controls the output voltage of the power conversion device 2400 to increase by increasing the switching of the switch 40.

The PWM controller 30 may function to control the output of the power conversion device 2400 and mainly have the form of IC pre-manufactured by chip manufacturers. The PWM controller 30 controls the switch 40 to enable PWM switching.

Figure 5A:
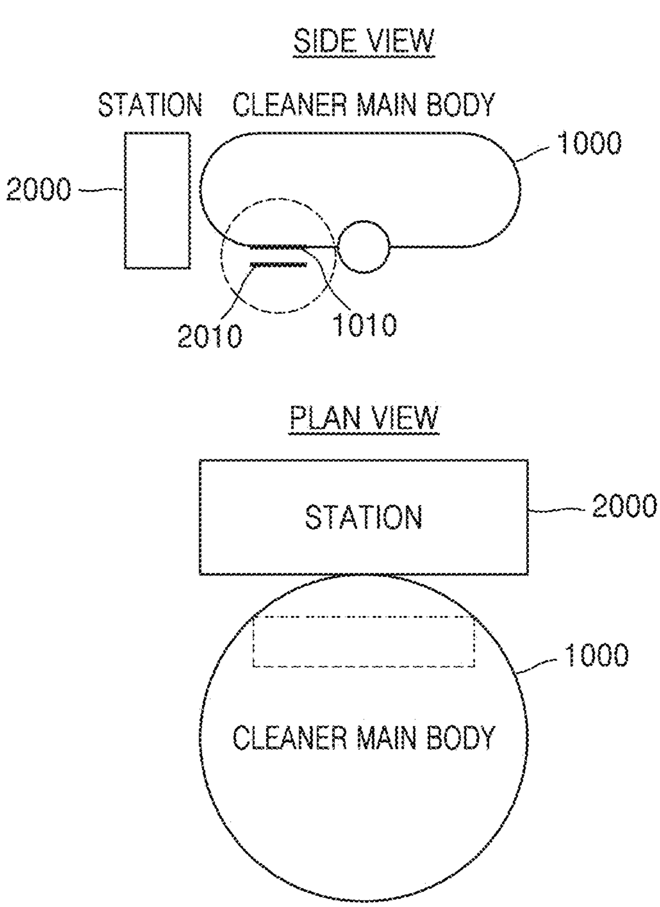
FIG. 5A is a view illustrating a structure in which a cleaner main body is coupled to a station, according to an embodiment of the disclosure.

FIG. 5A includes a side view and an aerial view illustrating a structure in which the cleaner main body 1000 is coupled to the station 2000, according to an embodiment of the disclosure.

Referring to FIG. 5A, the first charge terminal 1010 is provided on the bottom surface of the cleaner main body 1000, and when the cleaner main body 1000 accesses the station 2000 to be docked thereat, the first and second charge terminals 1010 and 2010 are in contact with each other on the bottom surface of the cleaner main body 1000.

Figure 5B:
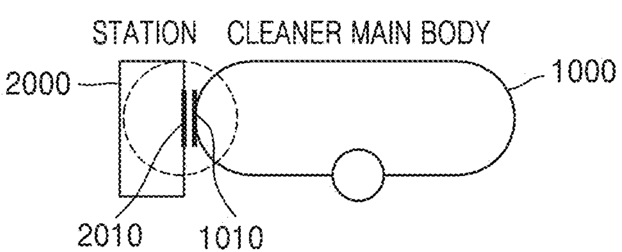
FIG. 5B is a view illustrating a structure in which a cleaner main body is coupled to a station, according to an embodiment of the disclosure.
Figure 5B:
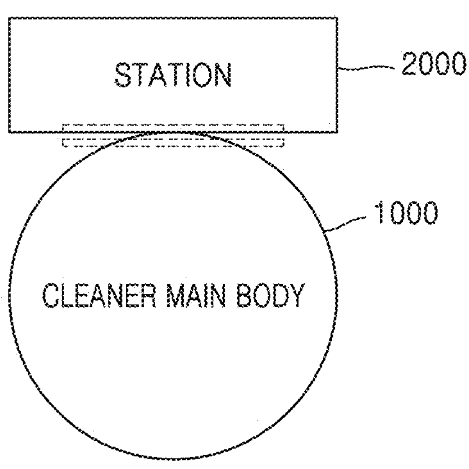

FIG. 5B includes a side view and a plan view illustrating a structure in which the cleaner main body 1000 is coupled to the station 2000, according to an embodiment of the disclosure.

Referring to FIG. 5B, the first and second charge terminals are provided on the side surfaces of the cleaner main body 1000 and the station 2000, and when the cleaner main body 1000 accesses the station 2000 to be docked thereat, the first and second charge terminals 1010 and 2010 are in contact with each other on the side surfaces of the cleaner main body 1000 and the station 2000. The method of coupling the first and second charge terminals 1010 and 2010 according to FIGS. 5A and 5B amounts to an optional feature of a designer. Whether the first and second charge terminals 1010 and 2010 are coupled on the bottom surface of the cleaner main body 1000 or on the side surfaces of the cleaner main body 1000 and the station 2000, or according to another coupling method, the charge terminal overheating prevention according to the disclosure may be identically applied.

The cleaner main body 1000 may perform the charging operation of the battery 1050 by recognizing the output voltage of the power conversion device 2400 in the station 2000, or the cleaner main body 1000 may perform a charging operation by recognizing the resistance value of the cleaner main body 1000 in the power conversion device 2400 of the station 2000. Alternatively, the charging operation may be performed in various methods, for example, a method of performing a charging operation when a mutual communication between the cleaner main body 1000 and the station 2000 is smoothly established. Accordingly, charge terminals for mutual contact are essential between chargers that the cleaner main body 1000 and the station 2000 include, and when docking is smoothly made between the cleaner main body 1000 and the station 2000, a charging voltage is applied to the charge terminals and a charging current flows through the charge terminals.

In an embodiment of the disclosure, a thermistor may be used as the temperature detection sensor capable of detecting a temperature. In an embodiment of the disclosure, the thermistor may be used in connection with a pull-up resistor connected to an input voltage VCC of the processor 2200 or the first processor 1001 or to a pull-down resistor of a ground GND. A middle point connected to the thermistor and the pull-up (or pull-down) resistor may be connected to an input port of an analog-digital conversion portion or the analog-digital conversion input port of the second processor 2200/the first processor 1001. The second processor 2200/ the first processor 1001 may detect the temperature of the charge terminals 1010 and 2010 by reading out a voltage value corresponding to the temperature from the analog-digital conversion portion or a voltage value corresponding to the temperature input to the analog-digital conversion input port, and may perform an overheating prevention operation to stop charging and/or provide separation between the cleaner main body 1000 and the station 2000 according to a change in the temperature of the charge terminals 1010 and 2010.

Figure 6:
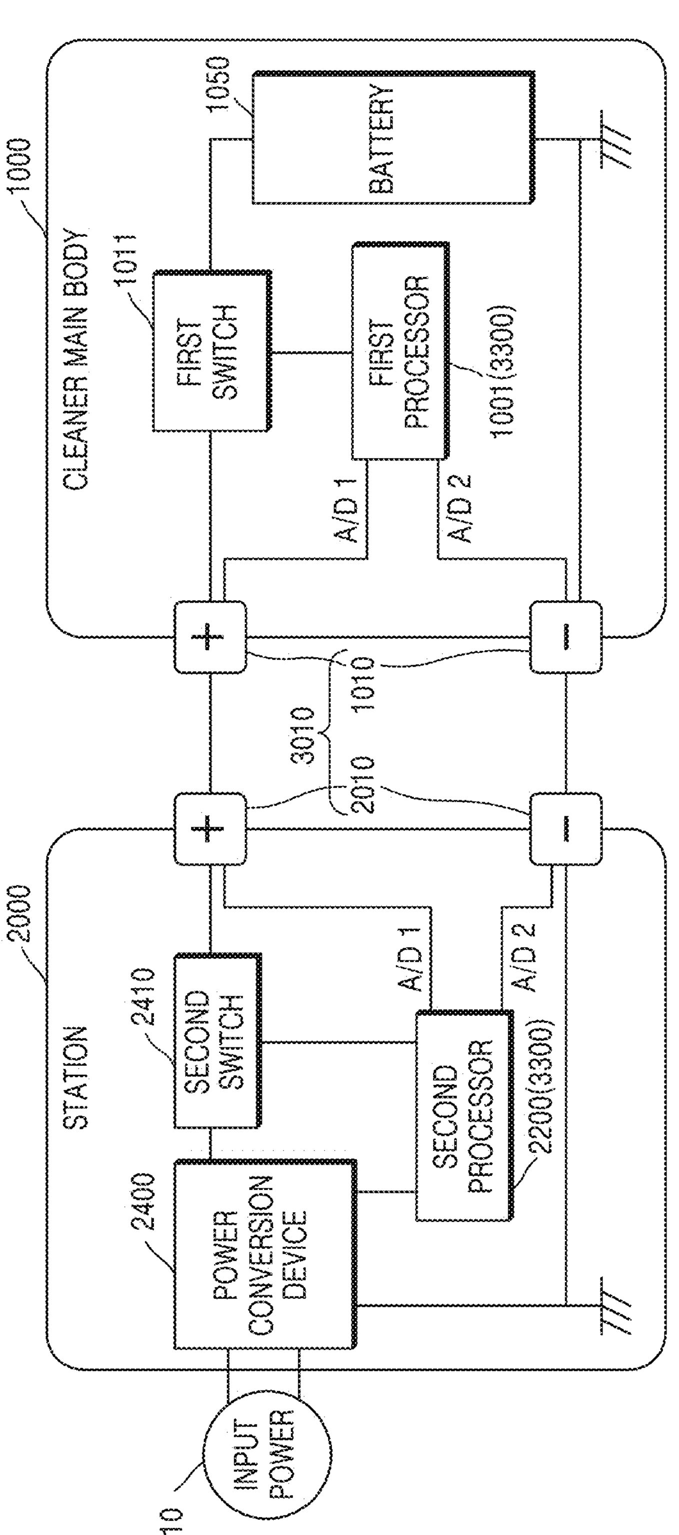
FIG. 6 is a view illustrating a structure in which a cleaner main body is coupled to a station, through a charge terminal, according to an embodiment of the disclosure.

FIG. 6 is a view illustrating a structure in which the cleaner main body 1000 is coupled to the station 2000, through the first and second charge terminals 1010 and 2010, according to an embodiment of the disclosure.

Referring to FIG. 6, the station 2000 may include the power conversion device (adaptor or SMPS) 2400. The cleaner main body 1000 and the station 2000 are electrically connected to each other through the first charge terminal 1010 and the second charge terminal 2010. The first charge terminal 1010 and the second charge terminal 2010 may be collectively referred to a charge terminal 3010. In an embodiment of the disclosure, a temperature detection circuit 3100 to detect the temperature of the charge terminal 3010 may include the first temperature detection circuit 1100 at the side of the cleaner main body 1000 and the second temperature detection circuit 2100 at the side of the station 2000. The temperature detection circuit 3100 may include a thermistor as the temperature sensor, and the temperature sensor may be installed in the first charge terminal 1010 of the cleaner main body 1000 and/or the second charge terminal 2010 of the station 2000. A thermistor that is the temperature sensor may be installed in both of the charge terminals, and when the first charge terminal 1010 and the second charge terminal 2010 are electrically connected to each other such that the first charge terminal 1010 and the second charge terminal 2010 are in close contact with each other, the thermistor may be installed in the charge terminal at any one side. The output of the temperature detection circuit 3100 for detecting temperature may be input to the analog-digital conversion input port of the second processor 2200/the first processor 1001. In an embodiment of the disclosure, a processor 3300 may be the first processor 1001 of the cleaner main body 1000 or the processor 2200 of the station 2000. Accordingly, the first processor 1001 of the cleaner main body 1000 or the processor 2200 of the station 2000 may be collectively referred to as the processor 3300. In an example in which the processor 3300 does not include the analog-digital conversion portion, the processor 3300 may receive from a separate analog-digital conversion portion a value corresponding to an output voltage level (voltage value) of the temperature detection circuit 3100 input to the separate analog-digital conversion portion.

The first processor 1001 of the cleaner main body 1000 reads out a temperature value corresponding to the output voltage value of the first temperature detection circuit 1100. As a result, when it is detected that the read temperature value is higher than a certain temperature (e.g., 80° C.), the first processor 1001 performs an overheating prevention operation to protect the cordless vacuum cleaner 3000 from the overheating of the charge terminal 3010. Such a certain temperature may correspond to a certain threshold voltage level that is associated with an overheated charge terminal when read out by the analog-digital conversion input port. The overheating prevention operation is already described herein and a detailed description thereof is omitted.

Figure 7A:
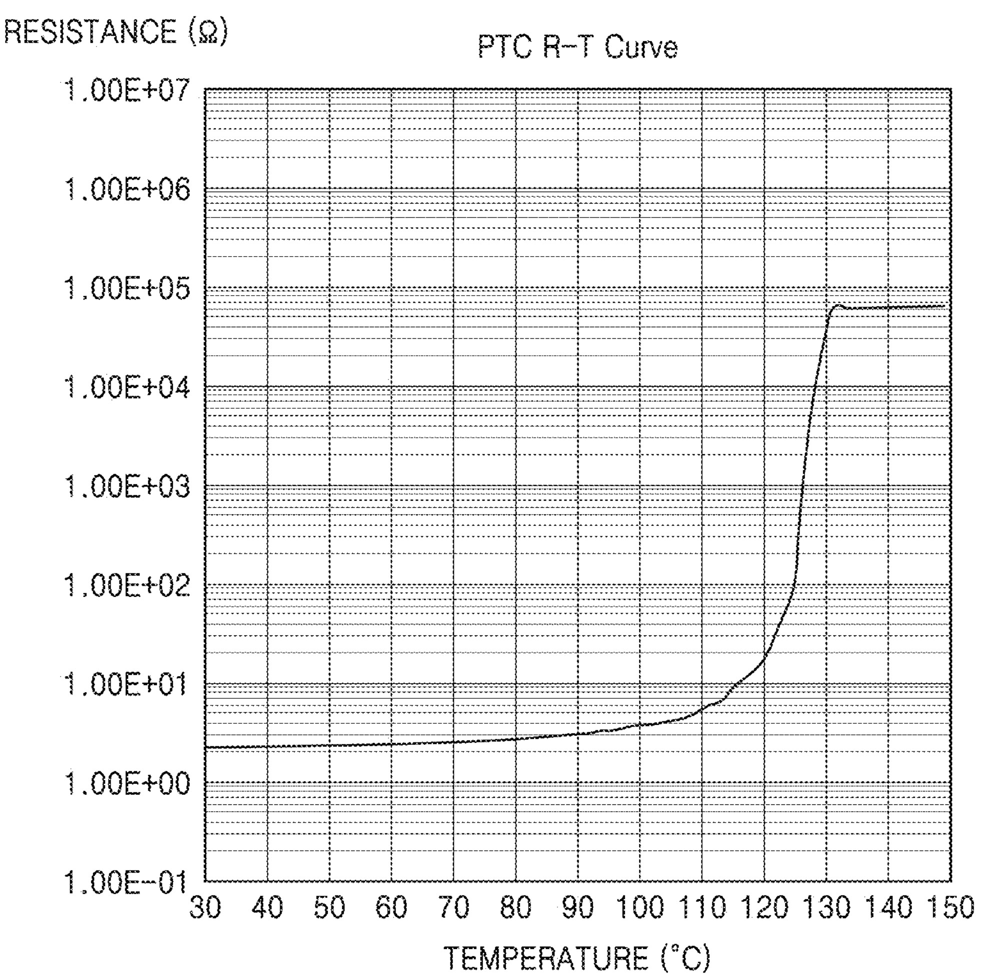
FIG. 7A is a characteristic curve graph of a thermistor as a temperature sensor used in a temperature detection circuit, according to an embodiment of the disclosure.

FIG. 7A is a characteristic curve graph of a thermistor as the temperature sensor used in the temperature detection circuit 3100, according to an embodiment of the disclosure.

Referring to FIG. 7A, a resistance (R)-temperature (T) characteristic curve graph of a PTC thermistor is illustrated as a temperature sensor used in the temperature detection circuit 3100. As illustrated in FIG. 7A, the resistance of a PTC thermistor characteristically increases as a temperature increases. In particular, as the PTC thermistor exhibits a noticeable change in resistance according to a temperature change between 90° C. and 130° C., the PTC thermistor is suitable for detecting overheating through a resistance change, that is, a resistance increase, between 90° C. and 130° C. Referring to FIG. 7A, it may be seen that the PTC thermistor has a value of about 20Ω at 120° C. and a value of about 30 kΩ at 130° C.

The characteristics of the PTC thermistor according to FIG. 7A are an example, and as applicable, a PTC thermistor having a different resistance value in a different temperature range may be employed.

Figure 7B:
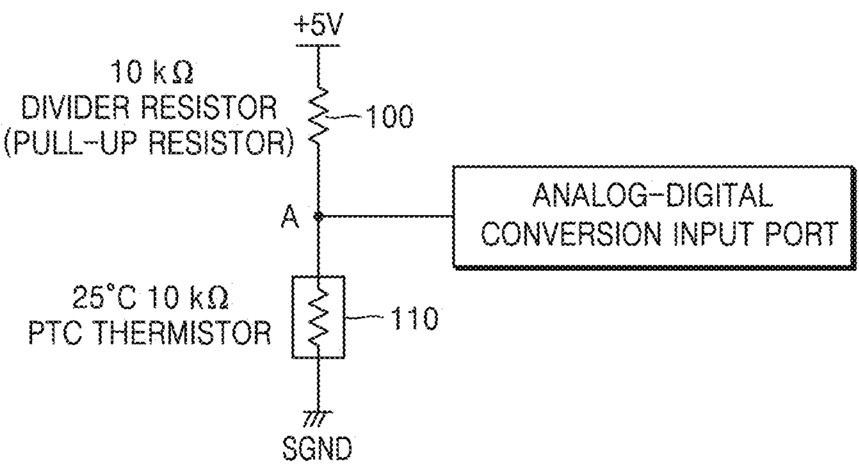
FIG. 7B is a circuit diagram of a temperature detection circuit using a thermistor according to an embodiment of the disclosure.

FIG. 7B is a circuit diagram of a temperature detection circuit (3100) using a thermistor according to an embodiment of the disclosure.

The temperature detection circuit of FIG. 7B may include a divider resistor 100 and a PTC thermistor 110 as a temperature sensor, and an output at a point A of the temperature detection circuit may be input to the analog-digital conversion input port. The PTC thermistor 110 may be installed in the charge terminal 3010 to detect the temperature of the charge terminal 3010. Alternatively, when it is difficult to install the PTC thermistor 110 to accurately contact the charge terminal 3010, the PTC thermistor 110 may be installed as close to the charge terminal 3010 as possible.

Referring to FIG. 7B, an input voltage of ±5 V is divided by the divider resistor 100 of 10 kΩ and the PTC thermistor 110. The divider resistor 100 is a resistor that divides the ±5 V input voltage with the PTC thermistor 110. Furthermore, in FIG. 7B, it may be seen that the divider resistor 100 is a pull-up resistor. The point A between the divider resistor 100 and the PTC thermistor 110 is connected to the analog-digital conversion input port. The ±5 V input voltage may be a DC voltage generated by the power conversion device 2400. Although FIG. 7B illustrates that there is one divider resistor as the divider resistor 100, the divider resistor 100 may include a plurality of divider resistors. Although FIG. 7B illustrates that the PTC thermistor 110 has a resistance of 10 kΩ at 25° C., the resistance of the PTC thermistor 110 for each temperature may vary according to the type of the PTC thermistor 110. In FIG. 7B, at 25° C., the voltage applied to the point A is 2.5 V. Assuming that a temperature that is determined by the charge terminal 3010 to be overheating is 80° C., when the resistance of the PTC thermistor 110 is 70 kΩ at 80° C., the voltage applied to the point A is 4.38 V. Accordingly, the processor 3300 having detected a digital value corresponding to 4.38 V may determine that the charge terminal 3010 is overheating. The processor 3300 having determined that the charge terminal 3010 is overheated may subsequently perform an overheating prevention operation. The temperature that is determined by the charge terminal 3010 as the threshold temperature representative of overheating may be freely selected by a designer according to the specifications of the cordless vacuum cleaner 3000 or the charge terminal 3010. As such, the point A where a voltage value varying based on a change in the resistance of the PTC thermistor 110 according to the temperature change is read may be the output of the temperature detection circuit.

A case of applying the temperature detection circuit of FIG. 7B to the circuit of FIG. 6 is described. For example, in FIG. 6, when the output of the first temperature detection circuit 1100 connected to the first charge terminal 1010 at the (+) side is connected to an analog-digital conversion input port 1 A/D 1, and the output of the first temperature detection circuit 1100 connected to the first charge terminal 1010 at the (−) side is connected to an analog-digital conversion input port 2 A/D 2, the first processor 1001 may determine which of the (+) and (−) sides of the first charge terminal 1010 is overheated. In other words, when a value corresponding to a certain threshold voltage level that is associated with an overheated charge terminal is detected from the values input to the analog-digital conversion input port 1 A/D 1 and the analog-digital conversion input port 2 A/D 2 of the first processor 1001, the first processor 1001 may determine that the corresponding (+) or (−) charge terminal is overheating. Accordingly, the first processor 1001 may output, by voice, display, or the like, accurately in which charge terminal overheating occurs, through the second user interface 2500. The cordless vacuum cleaner 3000 may transmit to a manufacturer's server information about the charge terminal at which overheating occurs such that a manufacturer may provide customer service.

The above description about in which charge terminal of the first charge terminal 1010 overheating occurs may be identically applied to the second charge terminal 2010 at the side of the station 2000.

Figure 7C:
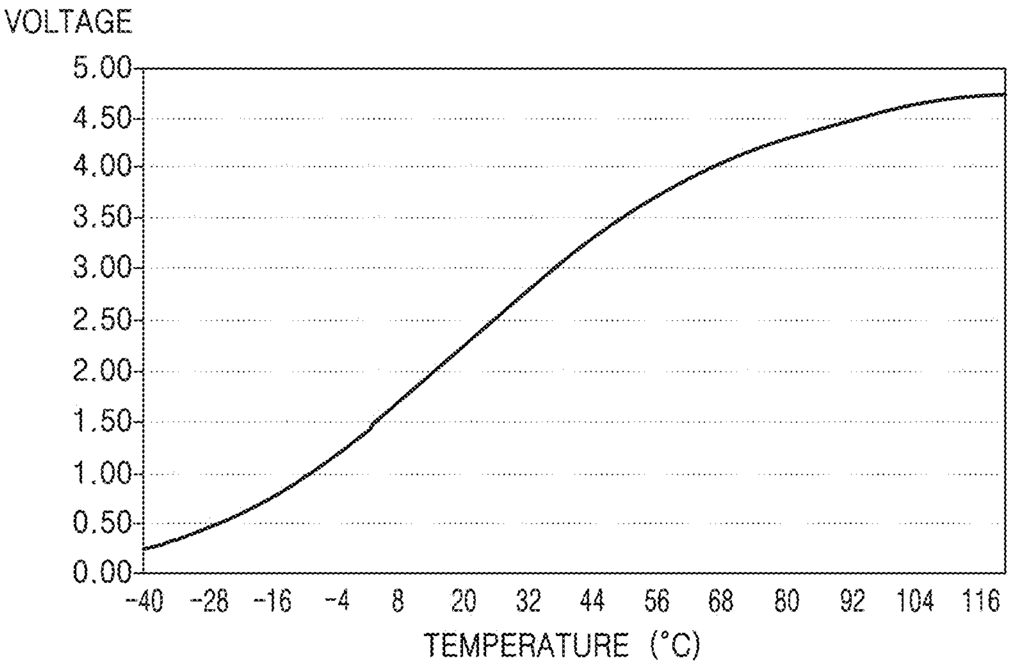
FIG. 7C is a graph illustrating a voltage level of a voltage output from a temperature detection circuit according to a change in the temperature of a charge terminal, according to an embodiment of the disclosure.

FIG. 7C is a graph illustrating a voltage level of a voltage output from a temperature detection circuit 3100 according to a change in the temperature of a charge terminal, according to an embodiment of the disclosure.

When the PTC thermistor 110 in which resistance increases according to the temperature is used in the temperature detection circuit of FIG. 7B, the voltage output from the point A may vary according to the temperature as illustrated in FIG. 7C. For example, as illustrated in FIG. 7C, when the resistance of the PTC thermistor 110 is 10 kΩ at 25° C., the voltage applied to the point A is 2.5 V, and when the resistance of the PTC thermistor 110 is 70 kΩ at 80° C., the voltage applied to the point A is 4.38 V.

Figure 8A:
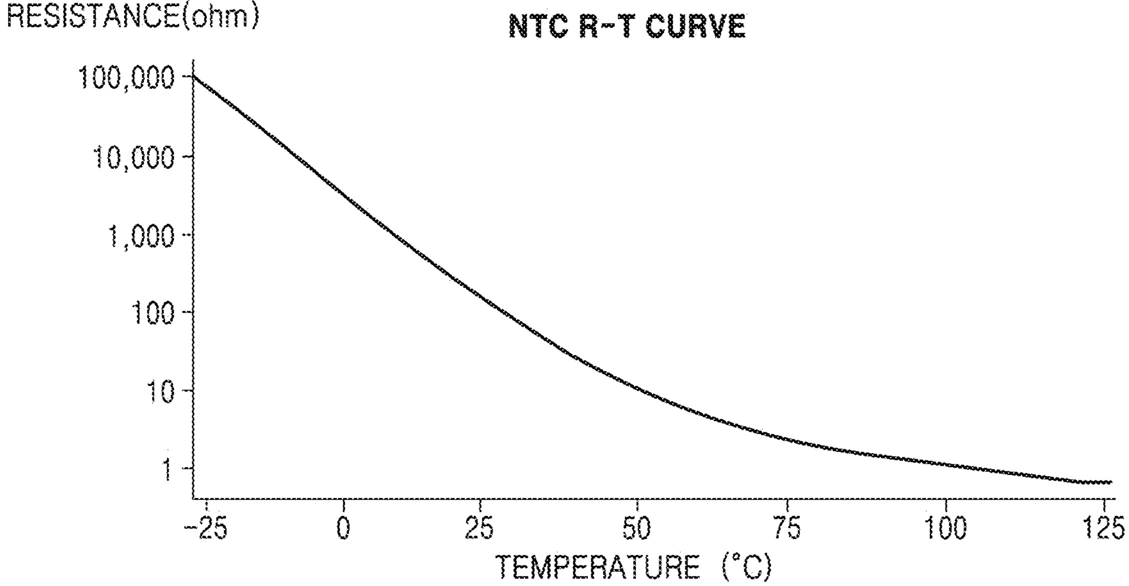
FIG. 8A is a characteristic curve graph of a thermistor as a temperature sensor used in a temperature detection circuit, according to an embodiment of the disclosure.

FIG. 8A is a characteristic curve graph of a thermistor as a temperature sensor used in a temperature detection circuit 3100, according to an embodiment of the disclosure.

Referring to FIG. 8A, an R-T characteristic curve graph is illustrated for an NTC thermistor used as a temperature sensor in the temperature detection circuit 3100. As illustrated in FIG. 8A, the resistance of the NTC thermistor characteristically decreases as a temperature increases. In particular, as the PTC thermistor exhibits a uniform change in resistance according to a temperature change between −25° C. to 125° C., the PTC thermistor is suitable for detecting overheating through a resistance change, that is, a resistance decrease, between −25° C. to 125° C. The NTC thermistor may have a resistance value of, for example, 100Ω at 25° C., and 1 (2 at 100° C.

The characteristics of the NTC thermistor according to FIG. 8A are an example, and as applicable, an NTC thermistor having a different resistance value in the corresponding temperature range may be employed.

Figure 8B:
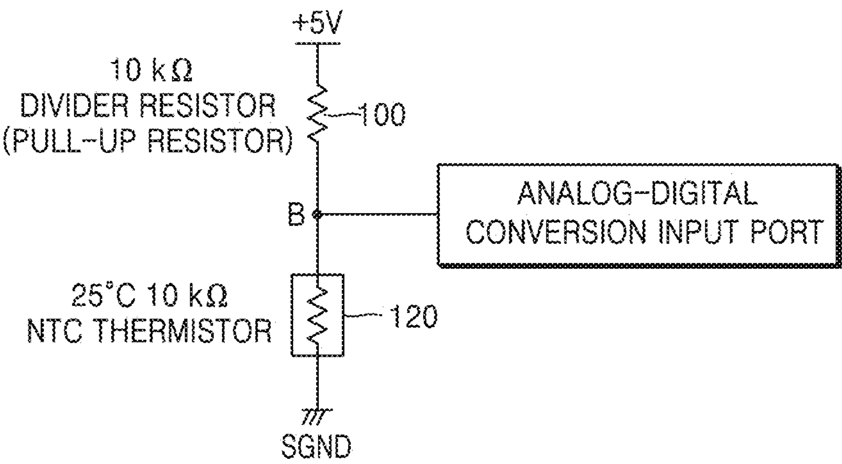
FIG. 8B is a circuit diagram of a temperature detection circuit using a thermistor according to an embodiment of the disclosure.

FIG. 8B is a circuit diagram of a temperature detection circuit using a thermistor according to an embodiment of the disclosure.

The temperature detection circuit of FIG. 8B may include the divider resistor 100 and an NTC thermistor 120 as a temperature sensor, and an output of the point B of temperature detection circuit may be input to the analog-digital conversion input port.

The NTC thermistor 120 may be installed in the charge terminal 3010 to detect the temperature of the charge terminal 3010. Alternatively, when it is difficult to install the NTC thermistor 120 to accurately contact the charge terminal 3010, the NTC thermistor 120 may be installed as close to the charge terminal 3010 as possible. The divider resistor 100 may is a resistor that divides an input voltage of ±5 V with the NTC thermistor 120.

Referring to FIG. 8B, the input voltage of ±5 V is divided by the divider resistor 100 of 10 kΩ and the NTC thermistor 120. In FIG. 8B, the divider resistor 100 is a pull-up resistor. The point B between the divider resistor 100 and the NTC thermistor 120 is connected to the analog-digital conversion input port. The ±5 V input voltage may be a DC voltage generated by the power conversion device 2400. Although FIG. 8B illustrates that there is one divider resistor as the divider resistor 100, the divider resistor 100 may include a plurality of divider resistors. Although FIG. 8B illustrates that the NTC thermistor 120 has a resistance of 10 kΩ at 25° C., the resistance of the NTC thermistor 120 for each temperature may vary according to the type of the NTC thermistor 120. In FIG. 8B, at 25° C., the voltage applied to the point B is 2.5 V. In an example in which the resistance of the NTC thermistor 120 is 1.5 kΩ at 80° C. at which the charge terminal 3010 is determined to be overheated, the voltage applied to the point B is 0.65 V. Accordingly, the processor 3300 having detected a digital value corresponding to 0.65 V may determine that the charge terminal 3010 is overheating. The processor 3300 having determined that the charge terminal 3010 is overheated may selectively perform an overheating prevention operation. The temperature that is determined by the charge terminal 3010 as the threshold temperature representative of overheating may be freely selected by a designer according to the specifications of the cordless vacuum cleaner 3000 or the charge terminal 3010. As such, the point B where a voltage value varying based on a change in the resistance of the NTC thermistor 110 is read may be the output of the temperature detection circuit.

A case of applying the temperature detection circuit of FIG. 8B to the circuit of FIG. 6 is described. As an example of detecting the position of a charge terminal to be overheated in the cleaner main body 1000 in the PTC thermistor 110 is described herein, an embodiment to detect the position of a charge terminal to be overheated in the station 2000 is now described.

For example, in FIG. 6, when the output of the second temperature detection circuit 2100 connected to the second charge terminal 2010 at the (+) side is connected to the analog-digital conversion input port 1 A/D 1 of the processor 2200, and the output of the second temperature detection circuit 2100 connected to the second charge terminal 2010 at the (−) side is connected to the analog-digital conversion input port 2 A/D 2 of the processor 2200, the processor 2200 may determine which of the (+) and (−) sides of the second charge terminal 2010 is overheated. In other words, when a value corresponding to a certain threshold voltage level that is associated with an overheated charge terminal is detected from the values input to the analog-digital conversion input port 1 A/D 1 and the analog-digital conversion input port 2 A/D 2 of the processor 2200, the second processor 2200 may determine that the corresponding (+) or (−) charge terminal is overheating. Accordingly, the processor 2200 may accurately output, by voice, display, or the like, in which charge terminal overheating occurs, through the second user interface 2500. The cordless vacuum cleaner 3000 may transmit to a manufacturer's server information about the charge terminal at which overheating occurs such that a manufacturer may provide customer service.

The above description about in which charge terminal of the second charge terminal 2010 of the station 2000 overheating occurs may be identically applied to the first charge terminal 1010 at the side of the cleaner main body 1000.

Figure 8C:
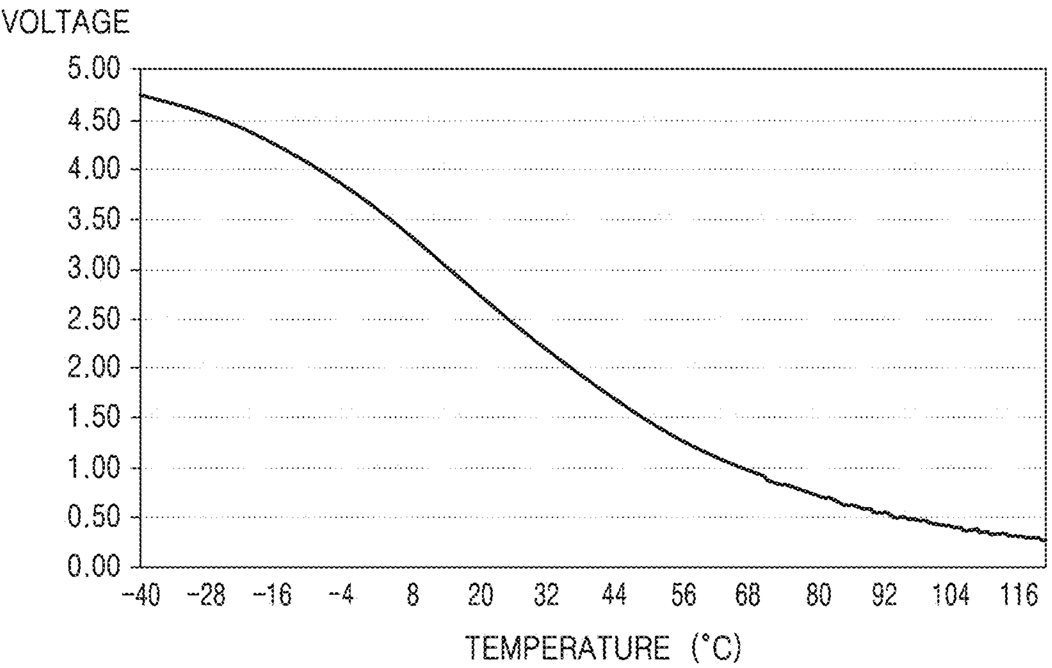
FIG. 8C is a graph illustrating a voltage level of a voltage output from a temperature detection circuit according to a change in the temperature of a charge terminal, according to an embodiment of the disclosure.

FIG. 8C is a graph illustrating a voltage level of a voltage output from a temperature detection circuit according to a change in the temperature of a charge terminal, according to an embodiment of the disclosure.

When the NTC thermistor 120 having resistance increasing according to a temperature is used in the temperature detection circuit of FIG. 8B, the voltage applied to the point B may vary according to the temperature as illustrated in FIG. 8C. For example, as illustrated in FIG. 8C, when the resistance of the NTC thermistor 120 is 10 kΩ at 25° C., the voltage applied to the point B is 2.5 V, and when the resistance of the NTC thermistor 120 is 1.5 kΩ at 80° C., the voltage applied to the point B is 0.65 V.

Figure 9A:
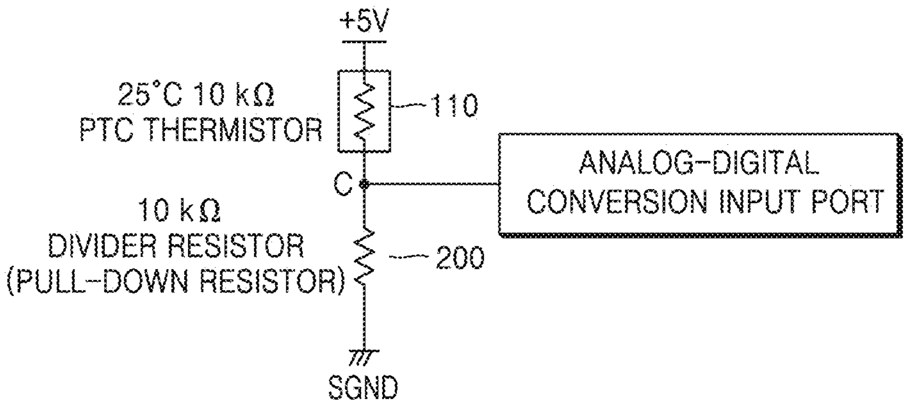
FIG. 9A is a circuit diagram of a temperature detection circuit according to an embodiment of the disclosure.

FIG. 9A is a circuit diagram of a temperature detection circuit according to an embodiment of the disclosure.

FIG. 7B illustrates the temperature detection circuit in which the divider resistor 100 that is a pull-up resistor and the PTC thermistor 110 are connected to each other, and FIG. 8B illustrates the temperature detection circuit in which the divider resistor 100 that is a pull-up resistor and the NTC thermistor 120 are connected to each other.

Figure 9B:
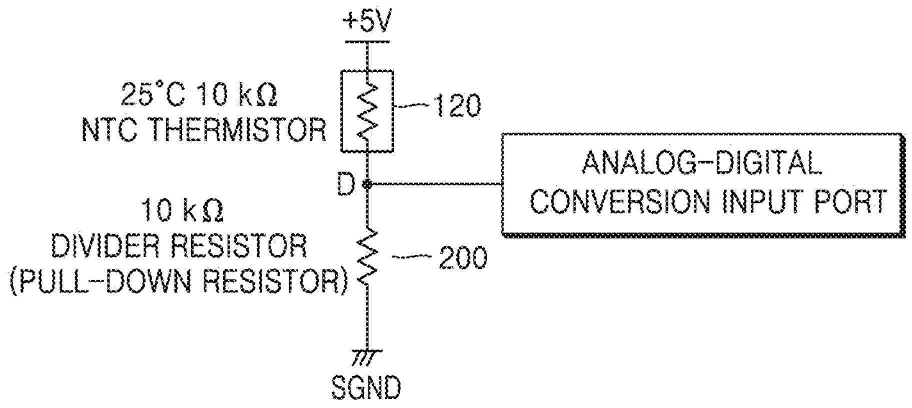
FIG. 9B is a circuit diagram of a temperature detection circuit according to an embodiment of the disclosure.

In FIGS. 9A and 9B, a temperature detection circuit using a pull-down resistor instead of pull-up resistor as a divider resistor 200 is illustrated. In FIG. 9A, the temperature detection circuit may include the divider resistor 200 and the PTC thermistor 110 as a temperature sensor. The output of an output C of the temperature detection circuit may be input to the analog-digital conversion input port. Referring to FIG. 9A, the ±5 V input voltage may be divided by the PTC thermistor 110 and the divider resistor 200.

Although FIG. 9A illustrates that the PTC thermistor 110 has a resistance of 10 kΩ at 25° C., the resistance for each temperature may vary according to the type of the PTC thermistor 110. In FIG. 9A, at 25° C., the voltage applied to a point C is 2.5 V. It is assumed that a temperature that is determined by the charge terminal 3010 to be overheating is 80° C. In an example in which the resistance of the PTC thermistor 110 is 70 kΩ at 80° C., the voltage applied to the point C is 0.63 V. Accordingly, the processor 3300 having detected a digital value corresponding to 0.63 V may determine that the charge terminal 3010 is overheating and perform an overheating prevention operation. The temperature that is determined by the charge terminal 3010 as the threshold temperature representative of overheating may be freely selected by a designer according to the specifications of the cordless vacuum cleaner 3000 or the charge terminal 3010.

FIG. 9B is a circuit diagram of a temperature detection circuit according to an embodiment of the disclosure.

In FIG. 9B, the temperature detection circuit may include the divider resistor 200 and the NTC thermistor 120 as a temperature sensor. The output of a point D of the temperature detection circuit may be input to the analog-digital conversion input port. Referring to FIG. 9B, the ±5 V input voltage may be divided by the NTC thermistor 120 and the divider resistor 200.

Although FIG. 9B illustrates that the NTC thermistor 120 has the resistance of 10 kΩ at 25° C., resistance for each temperature may vary according to the type of the NTC thermistor 120. In FIG. 9B, at 25° C., the voltage applied the point D is 2.5 V. It is assumed that a temperature that is determined the charge terminal 3010 to be overheating is 80° C. In an example in which the resistance of the NTC thermistor 120 is 1.5 kΩ at 80° C., the voltage applied the point D is 4.35 V. Accordingly, the processor 3300 having detected a digital value corresponding to 4.35 V may determine that the charge terminal 3010 is overheating and perform an overheating prevention operation. The temperature that is determined by the charge terminal 3010 as the threshold temperature representative of overheating may be freely selected by a designer according to the specifications of the cordless vacuum cleaner 3000 or the charge terminal 3010.

Figure 10:
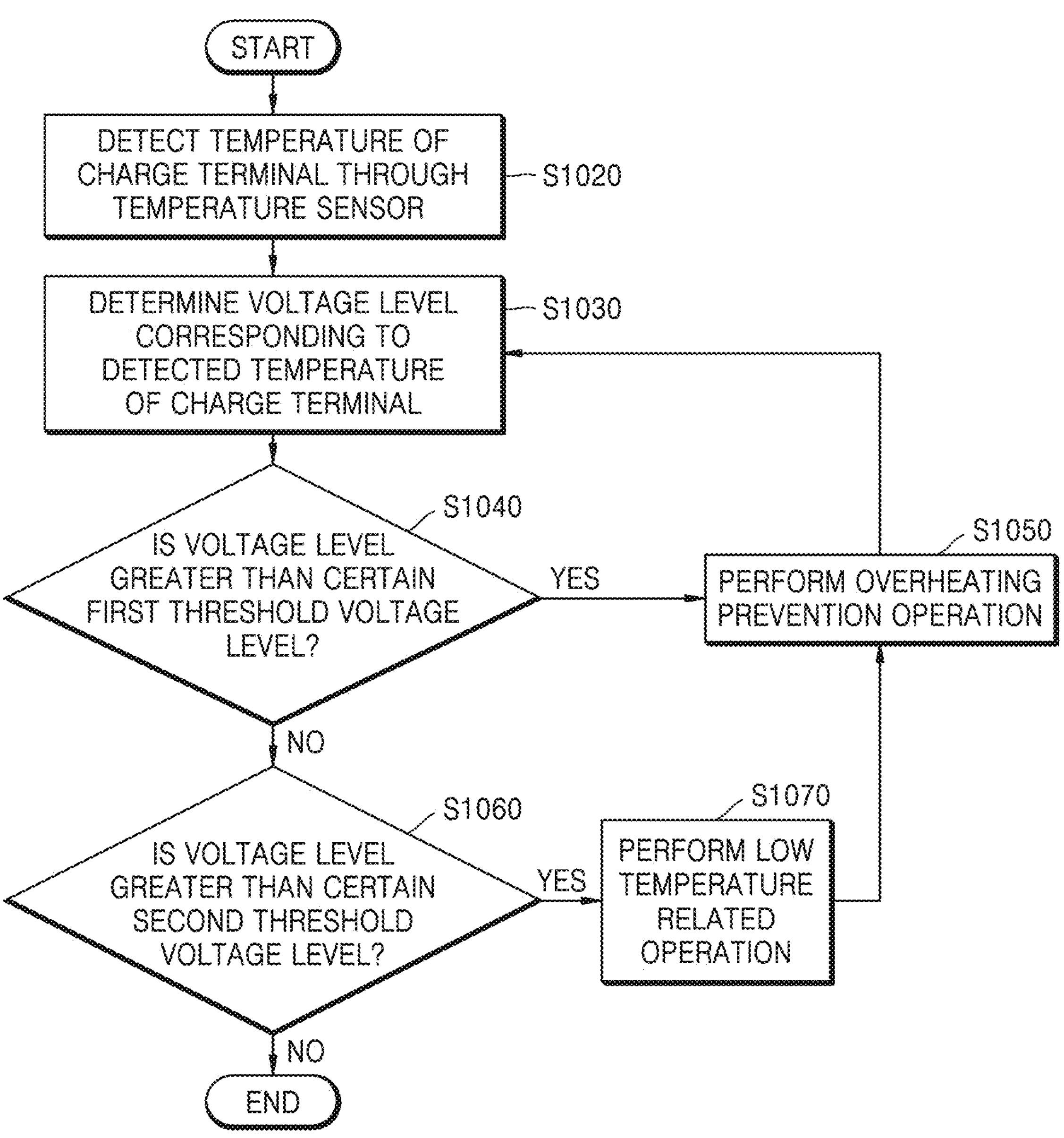
FIG. 10 is a flowchart of a method of preventing overheating of a charge terminal of a cordless vacuum cleaner, according to an embodiment of the disclosure.

FIG. 10 is a flowchart of a method of preventing overheating of a charge terminal of the cordless vacuum cleaner 3000, according to an embodiment of the disclosure.

In operation S1020, the cordless vacuum cleaner 3000 detects the temperature of the charge terminal 3010 through the thermistor installed in the charge terminal 3010 and the temperature detection circuit including the thermistor. At this time, the temperature detection circuit may include at least one divider resistor and a temperature sensor to divide an input voltage. In operation S1030, the cordless vacuum cleaner 3000 detects and determines a voltage level corresponding to the temperature of the charge terminal 3010 detected through the temperature detection circuit including the at least one divider resistor and the temperature sensor.

In operation S1040, the cordless vacuum cleaner 3000 compares the voltage level determined in operation S1030 with a certain first threshold voltage level. The certain first threshold voltage level corresponds to a temperature that is determined by the charge terminal 3010 to be overheating. In an example in which the temperature detection circuit of the cordless vacuum cleaner 3000 is the temperature detection circuit of FIG. 8B, a certain first threshold voltage level may be 0.65 V. Accordingly, when the voltage level determined in operation S1030 is less than 0.65 V, the cordless vacuum cleaner 3000 may determine that the charge terminal 3010 is overheating. In operation S1040, the cordless vacuum cleaner 3000 compares the voltage value according to the temperature detection circuit determined in operation S1030 with a certain first threshold voltage level. In an example in which the temperature detection circuit of the cordless vacuum cleaner 3000 is the temperature detection circuit in FIG. 7B, the certain first threshold voltage level may be 4.38 V. In an example in which the voltage level determined in operation S1030 is greater than 4.38 V, the cordless vacuum cleaner 3000 may determine that the charge terminal 3010 is overheating.

In operation S1050, when the charge terminal 3010 is determined to be overheated, the cordless vacuum cleaner 3000 performs an overheating prevention operation. The overheating prevention operation may include at least one of the operation of separating the cleaner main body 1000 and the station 2000 from each other by a certain distance in the cordless vacuum cleaner 3000, the operation of turning off the first switch 1011 between the first charge terminal 1010 and the battery 1050 in the cleaner main body 1000, or the operation of turning off the second switch 2410 between the second charge terminal 2010 and the power conversion device 2400 in the station 2000. To perform the overheating prevention operation, the cleaner main body 1000 may transmit an overheating notification to the station 2000. Alternatively, to perform the overheating prevention operation, the station 2000 may transmit an overheating notification to the cleaner main body 1000.

After operation S1050 is performed, the cordless vacuum cleaner 3000 determines overheating and the method may include terminating the process of performing the overheating prevention operation. However, selectively, the method may include determining (at S1060) whether a temperature of the charge terminal 3010 is a low temperature which does not support charging the battery 1050.

In operation S1060, the cordless vacuum cleaner 3000 compares the voltage level determined in operation S1030 with a certain second threshold voltage level. The certain second threshold voltage level corresponds to a low temperature which does not support charging of the battery 1050. For example, the temperature corresponding to the second threshold voltage level may be 0° C.

In operation S1070, the cordless vacuum cleaner 3000 performs a low temperature related operation when the determined voltage level is compared with a certain second threshold voltage level and the temperature of the charge terminal 3010 is determined to fall to the low temperature at which the battery 1050 cannot be charged. In an embodiment of the disclosure, when the temperature detection circuit as in FIG. 7B is used the temperature detection circuit, and the low temperature at which the battery 1050 cannot be charged is 0° C., the certain second threshold voltage level is 1.20 V as illustrated in FIG. 7C. In an example in which the voltage level determined by the temperature detection circuit is lower than 1.20 V, the cordless vacuum cleaner 3000 may perform a low temperature related operation. In an embodiment of the disclosure, when the temperature detection circuit as illustrated in FIG. 8B is used as the temperature detection circuit, and the low temperature at which the battery 1050 cannot be charged is 0° C., the certain second threshold voltage level is 3.60 V as illustrated in FIG. 8C. In an example in which the voltage level determined by the temperature detection circuit is higher than 3.60 V, the cordless vacuum cleaner 3000 may perform a low temperature related operation.

In an embodiment of the disclosure, the low temperature related operation may be that the processor 2200 outputs, by voice, display, or the like, a message indicating that "the charge terminal is in a low temperature state such that the battery cannot be charged" through the second user interface 2500. In an embodiment of the disclosure, the low temperature related operation may be that the processor 2200 notifies a manufacturer's server or a user terminal, through the second communication interface 2300, that the charge terminal 3010 is in a low temperature state such that the battery cannot be charged.

As described herein, embodiments of the present disclosure support implementing the method described with reference to FIG. 10 with or without operations S1060 and S1070, and the embodiments support selective addition of operations S1060 and S1070 by the designer of the cordless vacuum cleaner 3000.

In the descriptions of the method and processes herein, the operations may be performed in a different order than the order shown and/or described, or the operations may be performed in different orders or at different times. Certain operations may also be left out of the method and processes, one or more operations may be repeated, or other operations may be added.

Figure 11A:
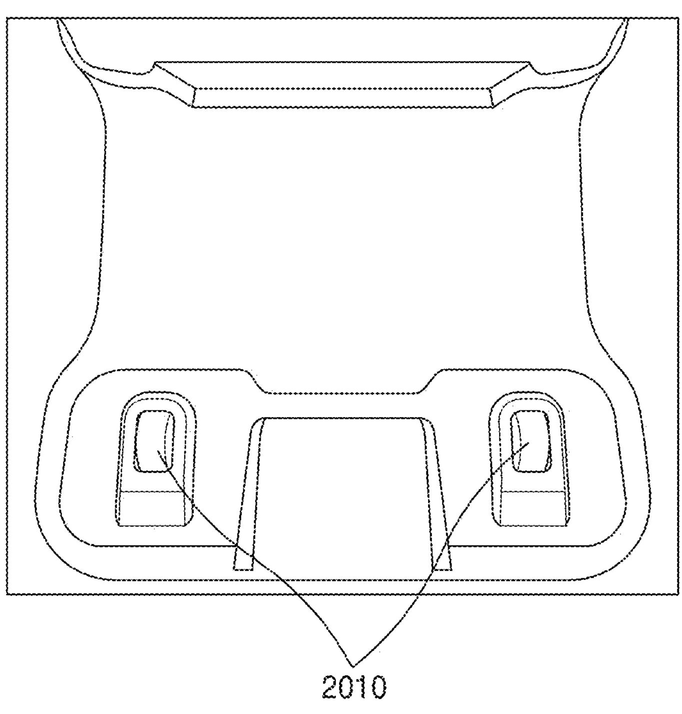
FIG. 11A illustrates a charge terminal of a station, according to an embodiment of the disclosure.

FIG. 11A illustrates a charge terminal of a station, according to an embodiment of the disclosure.

Referring to FIG. 11A the second charge terminal 2010 is installed on the bottom surface of the station 2000. However, this is an example embodiment, and the second charge terminal 2010 may be installed on the side surface of the station 2000, as described herein. In an example in which the cleaner main body 1000 is docked with the station 2000, for some reasons, such as, for example, foreign materials, a material of wood flooring, or a material of a carpet or vinyl flooring, adhering to the second charge terminal 2010, the location of the station 2000, an obstacle between the station 2000 and the cleaner main body 1000, disturbance by pets and kids, and the like, a contact the first charge terminal 1010 of the cleaner main body 1000 and the second charge terminal 2010 of the station 2000 may not be performed appropriately. In this case, the contact resistance between the charge terminals 1010 and 2010 may abnormally increase, and in the state, during charging of the battery 1050 of the cleaner main body 1000, overheating may occur in the charge terminal 3010.

Figure 11B:
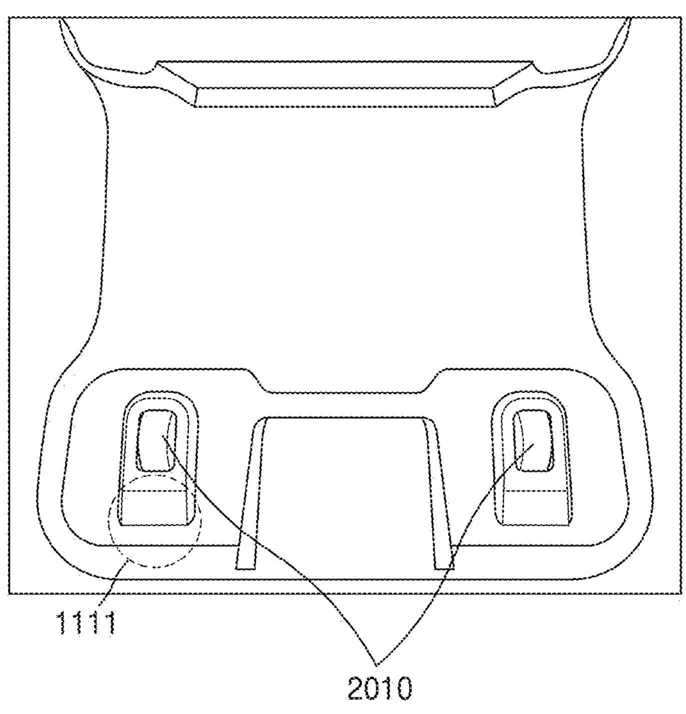
FIG. 11B illustrates an installation position of a thermistor in a charge terminal, according to an embodiment of the disclosure.

FIG. 11B illustrates an installation position of a temperature sensor in a charge terminal, according to an embodiment of the disclosure.

Although FIG. 11B illustrates the second charge terminal 2010 of the station 2000 as an example, in the description of installing a thermistor in the charge terminals 1010 and 2010 as a temperature sensor, the charge terminal 3010 may be understood as including both of the first charge terminal 1010 of the cleaner main body 1000 and the second charge terminal 2010 of the station 2000. Referring to FIG. 11B, by installing the thermistor 110 or 120, as a temperature sensor, in a vicinity 1111 as close as possible to the charge terminal 3010 with an external injection molded part taken off, the overheating of the charge terminal 3010 may be accurately detected. The thermistor 110 or 120 may be installed to be in direct contact with the charge terminal 3010. However, considering the product characteristics of the cordless vacuum cleaner 3000, a portion in direct contact with the charge terminal 3010 is weak to dust or electrostatic charge (ESD). Accordingly, even when an actual temperature is not accurately reflected, the thermistor 110 or 120 may be installed at a position a part from the charge terminal 3010 by a certain distance, for example, 5 mm to 3 cm. In an example in which the thermistor 110 or 120 is installed apart from the charge terminal 3010 by a certain distance, there may be a slight difference between the temperature measured by the thermistor 110 or 120 and the temperature of the charge terminal 3010. Accordingly, to compensate for the difference, the cordless vacuum cleaner 3000 may store and use a mapping table containing a relationship between the temperature measured by the thermistor 110 or 120 and the temperature measured by the charge terminal 3010. As an example, Table 1 below illustrates an example of a mapping table between the temperature measured by the thermistor 110 or 120 and the temperature measured by the charge terminal 3010, when a separation distance between the thermistor 110 or 120 and the charge terminal 3010 is 5 mm.

TABLE 1

| | | | | | |
|---|---|---|---|---|---|
| Temperature Measured by Thermistor | 1.8° C. | 23.5° C. | 48° C. | 72.1° C. | 94.5° C. |
| Temperature of Charge Terminal | 0° C. | 25° C. | 50° C. | 75° C. | 100° C. |

Through the mapping table as above, the processor 3300 may obtain the actual temperature of the charge terminal 3010 based on the temperature measured by the thermistor 110 or 120. The mapping table (e.g., mappings provided by the mapping table) according to Table I may vary according to a distance between the thermistor 110 or 120 and the charge terminal 3010, a material at a position where the thermistor 110 or 120 is installed, and the installation environment of the charge terminal 3010. In some aspects, a manufacturer may obtain a mapping table through experiments and store the obtained mapping table in a memory of the cordless vacuum cleaner 3000.

Although the thermistor 110 or 120 is assumed to be a temperature sensor in the above description, in addition to the thermistor 110 or 120, any other component capable of measuring the temperature of the charge terminal 3010 may be employed as the temperature sensor.

FIG. 13 is a flowchart of an overheating prevention operation according to an embodiment of the disclosure.

First, in operation S1310, the cordless vacuum cleaner 3000 determines that the charge terminal 3010 is overheated. In determining that the charge terminal 3010 is overheated, operation S1310 may include using a temperature detection circuit including a temperature sensor including a thermistor. The temperature detection circuit of FIGS. 7B, 8B, 9A, and 9B may be used as the temperature detection circuit, but embodiments of the present disclosure are not limited thereto. The temperature sensor of the temperature detection circuit may be installed directly in or within a certain distance from the charge terminal 3010 and be configured to detect the temperature of the charge terminal 3010. The temperature sensor may be installed at least one of the first charge terminal 1010 or the second charge terminal 2010 of the station 2000.

In an embodiment of the disclosure, when the temperature detection circuit detects that the temperature measured by the charge terminal 3010 reaches a certain temperature or more that is an overheating reference (i.e., a threshold temperature representative of overheating), the processor 3300 determines that the charge terminal 3010 is overheated.

First, a case in which the temperature sensor is installed in the first charge terminal 1010 at the side of the cleaner main body 1000 and the first charge terminal 1010 is determined to be overheated is described. When determining that the first charge terminal 1010 is overheated, through the first temperature detection circuit 1100 connected to the first charge terminal 1010, the first processor 1001 of the cleaner main body 1000 may perform an overheating prevention operation. Further, when receiving, through communication from the station 2000, a notification that the second charge terminal 2010 is overheated, the first processor 1001 of the cleaner main body 1000 likewise may perform an overheating prevention operation.

In an embodiment of the disclosure, the first processor 1001 may block the electrical connection between the battery 1050 and the first charge terminal 1010 by turning off the first switch 1011 connecting the battery 1050 of the cleaner main body 1000 and the first charge terminal 1010 to each other (S1320). In an embodiment of the disclosure, when determining that the first charge terminal 1010 is overheated through the first temperature detection circuit 1100 connected to the first charge terminal 1010, the first processor 1001 may notify the station 2000 (at the side of the station 2000) of the overheating (S1330). For example, the first processor 1001 may provide a notification (e.g., including an indication that the first charge terminal 1010 is overheated), based on which the processor 2200 of the station 2000 may perform an overheating prevention operation (S1330). In an embodiment of the disclosure, the first processor 1001 may control, as an overheating prevention operation, the cleaner main body 1000 to be spaced apart from the station 2000 by a certain distance by driving the driving wheel 1062 of the cleaner main body 1000 (S1340).

Next, a case in which the temperature sensor is installed in the second charge terminal 2010 of the station 2000 and the second charge terminal 2010 is determined to be overheated is described. In an example in which determining that the second charge terminal 2010 is overheated through the second temperature detection circuit 2100 connected to the second charge terminal 2010, the processor 2200 may perform an overheating prevention operation. Further, when receiving a notification that the first charge terminal 1010 is overheated, through communication from the cleaner main body 1000, the processor 2200 likewise may perform an overheating prevention operation.

In an embodiment of the disclosure, the processor 2200 may block the electrical connection between the battery 1050 of the cleaner main body 1000 and the power conversion device 2400 by turning off the second switch 2410 connecting the power conversion device 2400 of the station 2000 and the second charge terminal 2010 to each other (S1350). In an embodiment of the disclosure, when determining that the second charge terminal 2010 is overheated through the second temperature detection circuit 2100 connected to the second charge terminal 2010, the processor 2200 may notify the cleaner main body 1000 of the overheating (S1360). For example, the processor 2200 may provide a notification (e.g., including an indication that the second charge terminal 2010 is overheated), based on which the first processor 1001 of the cleaner main body 1000 may perform an overheating prevention operation, for example, the operation according to operations S1320 and/or S1340 (S1360).

In an embodiment of the disclosure, the overheating prevention operation may be configured in two steps. In an example of determining that the second charge terminal 2010 is overheated through the second temperature detection circuit 2100 connected to the second charge terminal 2010, the processor 2200 may perform a "first-step switch-off" operation of turning off the second switch 2410 at the side of the station 2000 or turning the first switch 1011 off in the cleaner main body 1000 by transmitting an overheating notification to the cleaner main body 1000. In an example in which, in spite of the "first-step switch-off" operation, the temperature of the charge terminal 3010 is not reduced to a certain temperature for a certain time duration (e.g., 20 sec.), the cordless vacuum cleaner 3000 may perform a "second-step separation" operation of moving the cleaner main body 1000 to separate the cleaner main body 1000 and the station 2000 from each other.

In an embodiment of the disclosure, when a certain time duration (e.g., 1 min.) has elapsed after the overheating prevention operation of separating the cleaner main body 1000 and the station 2000 from each other, or the temperature of the charge terminal 3010 is detected have dropped to a certain temperature (e.g., to 70° C. from 80° C.), the cordless vacuum cleaner 3000 may control, as an overheating release operation, the cleaner main body 1000 in association with recoupling or redocking the cleaner main body 1000 to the station 2000.

The cordless vacuum cleaner 3000 according to an embodiment of the disclosure may include the battery 1050. The cordless vacuum cleaner 3000 according to an embodiment may include the cleaner main body 1000 including the first processor 1001 that controls performing of a cleaning function using power provided by the battery 1050. The cordless vacuum cleaner 3000 according to an embodiment may include the power conversion device 2400 that generates a voltage to charge the battery 1050 of the cleaner main body 1000. The cordless vacuum cleaner 3000 according to an embodiment may include the second charge terminal 2010 to charge the battery 1050 of the cleaner main body 1000 with the voltage generated by the power conversion device 2400. The cordless vacuum cleaner 3000 according to an embodiment may include the temperature sensor 110 or 120 installed within a certain distance from the second charge terminal 2010 to measure the temperature of the second charge terminal 2010, and at least one divider resistor 100 or 200 configured to provide a voltage by dividing the voltage level of an input voltage with the temperature sensor 110 or 120. The cordless vacuum cleaner 3000 according to an embodiment may include the station 2000 including the processor 2200 that controls performing of an overheating prevention operation when the voltage level of the voltage provided by at least one divider resistor 100 or 200 and the temperature sensor 110 or 120 is greater than a certain threshold voltage level.

In an embodiment of the disclosure, the station 2000 may further include the second switch 2410 to establish or disconnect the electric connection between the power conversion device 2400 and the second charge terminal 2010, and the overheating prevention operation may be an operation in which the processor 2200 turns the second switch 2410 off. In some aspects, the second switch 2410, when turned on, electrically connects the power conversion device 2400 to the second charge terminal 2010.

In an embodiment of the disclosure, the cleaner main body 1000 may further include the first communication interface 1080. In an embodiment of the disclosure, the station 2000 may further include the second communication interface 2300 to communicate with the first communication interface 1080 of the cleaner main body 1000. In an embodiment of the disclosure, the overheating prevention operation may be an operation in which the processor 2200 transmits an overheating notification to the first communication interface 1080 of the cleaner main body 1000 through the second communication interface 2300.

In an embodiment of the disclosure, the first processor 1001 may control the cleaner main body 1000 to be spaced apart from the station 2000 by a certain distance or more, through the first communication interface 1080, based on the received overheating notification.

In an embodiment of the disclosure, the processor 2200 may compare the voltage level of the voltage provided by at least one divider resistor 100 or 200 and the temperature sensor 110 or 120 with a certain release voltage level, and the processor 2200 may transmit an overheating release notification to the cleaner main body 1000 through the second communication interface 2300 and the first communication interface 1080, based on the determination according to a result of the comparison that the second charge terminal is released from the overheating state, and the first processor 1001 may control the cleaner main body 1000 to be recoupled with the station 2000 based on the overheating release notification received through the first communication interface 1080.

In an embodiment of the disclosure, the cleaner main body 1000 may further include the first charge terminal 1010 that electrically contacts the second charge terminal 2010 for charging and the first switch 1011 configured to block or provide a connection between the first charge terminal 1010 and the battery 1050, and the first processor 1001 may control turning off of the first switch 1011 based on the overheating notification received through the first communication interface 1080, where turning the first switch 1011 off may block the connection between the first charge terminal 1010 and the battery 1050.

In an embodiment of the disclosure, the temperature sensor may include the PTC thermistor 110 or the NTC thermistor 120, and a resistance of the temperature sensor changes according to a temperature change associated with the temperature sensor.

In an embodiment of the disclosure, at least one divider resistor 100 may be connected to the positive power side of an input voltage, and the temperature sensor 110 or 120 may be connected to a ground (e.g., the ground side of the input voltage). In an embodiment of the disclosure, the temperature sensor 110 or 120 may be connected to the positive power side of the input voltage, and at least one divider resistor 200 may be connected to the ground side.

In an embodiment of the disclosure, the station 2000 may further include the second user interface 2500, and when the second charge terminal 2010 is determined to be overheated, the processor 2200 may notify a user of the overheating of the second charge terminal 2010, by at least one of display or voice, through the second user interface 2500. Expressed another way, the processor 2200 may be further configured to provide an overheating notification to the user through the second user interface 2500 based on the processor 2200 determining that the second charge terminal 2010 is overheated, where the notification includes at least one of a visual alert and an audio alert. In an example, the processor 2200 may be configured to determine the second charge terminal 2010 is overheated based on the processor 2200 determining the voltage level of the voltage provided by the at least one divider resistor 100 and the temperature sensor is greater than the certain threshold voltage level.

In an embodiment of the disclosure, the station 2000 may further include the second communication interface 2300, and when the second charge terminal 2010 is determined to be overheated, the processor 2200 may notify a user terminal or a server of the overheating of the second charge terminal 2010 through the second communication interface 2300. Expressed another way, based on determining the second charge terminal 2010 is overheated, the processor 2200 may be further configured to provide a notification of overheating to a user terminal or a server through the second communication interface 2300 that the second charge terminal 2010 is overheated.

In an embodiment of the disclosure, the station 2000 may further include a first analog-digital conversion portion that detects and measures the voltage level measured at the plus (+) terminal of the second charge terminal 2010, and the second analog-digital conversion portion that detects and measures the voltage level measured at the minus (−) terminal of the second charge terminal 2010, the processor 2200 may determine in which terminal of the plus (+) terminal and the minus (−) terminal overheating occurs, based on the voltage level detected and measured through the first analog-digital conversion portion and the voltage level detected and measured through the second analog-digital conversion portion, and the notification of overheating may include information indicating in which terminal of the plus (+) terminal and the minus (−) terminal overheating occurs.

In an embodiment of the disclosure, the station 2000 may further include the second user interface 2500, the processor 2200 may compare the voltage level of the voltage provided by at least one divider resistor 100 or 200 and the temperature sensor 110 or 120 with a certain second threshold voltage level, and when the temperature of the second charge terminal 2010 is determined to be lower than a certain chargeable temperature, according to a result of the comparison, the station may control outputting, by at least one of display or voice, that charge through the second user interface 2500 is unavailable. Expressed another way, the processor 2200 may control outputting, through the second user interface 2500, a notification that charging the battery is unavailable, based on the processor 2200 determining a temperature of the second charge terminal 2010 is lower than a certain chargeable temperature according to a result of the comparison.

In an embodiment of the disclosure, the processor 2200 may correct the temperature measured by the temperature sensor 110 or 120 based on a mapping table illustrating a difference between an actual temperature of the second charge terminal 2010 and the temperature measured by the temperature sensor 110 or 120 installed within the certain distance from the second charge terminal 2010.

The cordless vacuum cleaner 3000 according to an embodiment of the disclosure may include the first charge terminal 1010 to charge the battery 1050 of the cleaner main body 1000 with the DC voltage transmitted from the station 2000. The cordless vacuum cleaner 3000 according to an embodiment may include the temperature sensor 110 or 120 installed within a certain distance from the first charge terminal 1010 and configured to measure the temperature of the first charge terminal 1010, and at least one divider resistor 100 or 200 that provide a voltage by dividing the DC voltage with the temperature sensor 110 or 120. The cordless vacuum cleaner 3000 according to an embodiment may include the cleaner main body 1000 that includes the first processor 1001 controlling performing of a cleaning function powered by the battery 1050 and performing of an overheating prevention operation when the voltage level of the voltage provided by the at least one divider resistor 100 and the temperature sensor 110 or 120 is greater than a certain threshold voltage level. The cordless vacuum cleaner 3000 according to an embodiment may include the station 2000 that includes the second charge terminal 2010 electrically connected to the first charge terminal 1010 and configured to charge the battery 1050 of the cleaner main body 1000, and the power conversion device 2400 connected to the second charge terminal 2010 and generating a DC voltage to charge the battery 1050.

In an embodiment of the disclosure, the overheating prevention operation may be an operation in which the first processor 1001 drives the cleaner main body 1000 in association with separating the cleaner main body 1000 from the station 2000 by a certain distance or more.

In an embodiment of the disclosure, the overheating prevention operation may be an operation in which the first processor 1001 turns the first switch 1011 off that connects the battery 1050 and the first charge terminal 1010 to each other.

In an embodiment of the disclosure, the cleaner main body 1000 may further include the first communication interface 1080, and the overheating prevention operation may be an operation in which the first processor 1001 transmits an overheating notification to the station 2000 through the first communication interface 1080.

In an embodiment of the disclosure, the station 2000 may further include the processor 2200, and the second switch 2410 that may block or provide the connection between the power conversion device 2400 and the second charge terminal 2010, and the processor 2200 may turn the second switch 2410 off based on receiving the overheating notification. In some aspects, turning the second switch 2410 off may block the connection between the power conversion device 2400 and the second charge terminal 2010.

In an embodiment of the disclosure, the cleaner main body 1000 may further include the first communication interface 1080, the station 2000 may further include the second user interface 2500, and the first processor 1001 may compare the voltage level of the voltage provided by at least one divider resistor 100 or 200 and the temperature sensor 110 or 120 with a certain second threshold voltage level, and output, through the first communication interface 1080, a notification to the station 2000 that charging the battery 1050 is unavailable, through the first communication interface 1080, based on the first processor 1001 determining the temperature is insufficient for charging the battery 1050 according to a result of the comparison, and the station 2000 may output a second notification that charging the battery 1050 is unavailable (e.g., a message indicating that it is unavailable to charge the battery 1050), through the second user interface 2500.

A method of preventing overheating of a charge terminal in a cordless vacuum cleaner, according to an embodiment of the disclosure may include determining, by a temperature sensor, a voltage level corresponding to a temperature of the charge terminal while a station is electrically connected to a cleaner main body through the charge terminal, wherein determining the voltage level comprises dividing, by the temperature sensor, an input voltage with a divider resistor.

A method of preventing overheating of a charge terminal in a cordless vacuum cleaner, according to an embodiment of the disclosure may include determining whether the charge terminal is overheated, by comparing a voltage level with a certain threshold voltage level. A method of preventing overheating of a charge terminal in a cordless vacuum cleaner, according to an embodiment of the disclosure may include, based on determining the charge terminal being is overheated, performing at least one overheating prevention operation of: an operation of separating a cleaner main body from a station, an operation of blocking, by a second switch, a connection between a power conversion device and a charge terminal in the station, and an operation of blocking a connection between a charge terminal and a battery by turning off a first switch in the cleaner main body.

A computer-readable storage medium, on which a method of preventing overheating of a charge terminal by a temperature sensor in a cleaner, according to an embodiment of the disclosure, is executable, may include a computer command to perform detecting a voltage level corresponding to the temperature of the charge terminal, by a temperature sensor that divides an input voltage with a divider resistor, while a station is electrically connected to a cleaner main body through the charge terminal. A computer-readable storage medium, on which a method of preventing overheating of a charge terminal by a temperature sensor in a cleaner, according to an embodiment of the disclosure, is executable, may include a computer command to perform determining whether the charge terminal is overheated, by comparing a voltage level with a certain threshold voltage level. A computer-readable storage medium, on which a method of preventing overheating of a charge terminal by a temperature sensor in a cleaner, according to an embodiment of the disclosure, is executable, may include a computer command to perform at least one overheating prevention operation from among, when the charge terminal is overheated based on the determining of overheating, an operation of separating a cleaner main body from a station, an operation of blocking, by a second switch, a connection from a power conversion device to a charge terminal in the station, and an operation of blocking a connection from a charge terminal to a battery by turning off a first switch in the cleaner main body.

The method according to an embodiment of the disclosure may be embodied in form of a program command executable through various computing devices, and may be recorded on a computer-readable medium. The computer-readable medium may include a program command, a data file, a data structure, or the like solely or by combining the same. A program command recorded on the medium may be specially designed and configured for the disclosure or may be a usable one, such as, for example, computer software, which is well known to one of ordinary skill in the art to which the disclosure pertains to. A computer-readable recording medium may include magnetic media such as, for example, hard discs, floppy discs, and magnetic tapes, optical media such as, for example, CD-ROM or DVD, magneto-optical media such as, for example, floptical disks, and hardware devices such as, for example, ROM, RAM flash memory, which are specially configured to store and execute a program command. An example of a program command may include machine codes created by a compiler and also high-level programming language executable by a computer using an interpreter.

An embodiment of the disclosure may be embodied in the form of a recording medium including computer executable instructions, such as a program module executed by a computer. A computer-readable storage medium may be a useable medium that is accessible by a computer and may include all of volatile and non-volatile media and separable and inseparable media. Furthermore, the computer-readable medium may include all of computer storage media and communication media. A computer storage medium may include all of volatile and non-volatile media and separable and inseparable media embodied by a method or technology for storing information, such as, for example, computer-readable instructions, data structures, program modules, or other data. The communication media may typically include computer-readable instructions, data structures, program modules, or other data of a modulated data signal such as a carrier wave, or other transmission mechanism, and may also include information transmission media. Furthermore, an embodiment of the disclosure may be embodied by a computer program including instructions executable by a computer, such as a computer program executed by a computer, or a computer program product.

A device-readable storage medium may be provided in the form of a non-transitory storage medium. Here, the "non-transitory storage medium" may mean that a storage medium is a tangible device, not including a signal, for example, an electromagnetic wave. However, the term does not distinguish a case of semi-permanently storing data in a storage medium from a case of temporarily storing data. For example, the "non-transitory storage medium" may include a buffer in which data is temporarily stored.

According to an embodiment of the disclosure, the method according to an embodiment disclosed herein may be provided by being included in a computer program product. A computer program product as goods may be dealt between a seller and a buyer. The computer program product is distributed in the form of a machine-readable storage medium, for example, a compact disc read only memory (CD-ROM), or through application stores, or can be distributed directly or online, for example, download or upload, between two user devices, for example, smart phones. In the case of online distribution, at least a part of the computer program product may be at least temporarily stored or temporarily generated in a machine-readable storage medium such as, for example, a manufacturer's server, an application store's server, or a memory of a relay server.

The invention claimed is:

1. A cordless vacuum cleaner comprising:

a cleaner main body; and a station, wherein the cleaner main body comprises:

- a battery;
- a first charge terminal configured to charge the battery;
- a first communication interface; and
- a first processor configured to control performing a cleaning function using power provided by the battery, and the station comprises:

- a power conversion device configured to generate a voltage to charge the battery of the cleaner main body;
- a second charge terminal configured to charge the battery of the cleaner main body with the voltage generated by the power conversion device;
- a temperature sensor installed within a certain distance from the second charge terminal and configured to detect a temperature of the second charge terminal;
- at least one divider resistor configured to provide a voltage by dividing an input voltage with the temperature sensor;

a second communication interface configured to communicate with the first communication interface of the cleaner main body; and a second processor configured to control performing an overheating prevention operation based on a voltage level of the voltage provided by the at least one divider resistor and the temperature sensor being greater than a certain first threshold voltage level, wherein:

the overheating prevention operation is an operation in which the second processor transmits an overheating notification to the first communication interface of the cleaner main body through the second communication interface, and the first processor is further configured to separate the cleaner main body from the station by a certain distance or more based on the overheating notification received through the first communication interface.

2. The cordless vacuum cleaner of claim 1, wherein:

the cleaner main body comprises a first switch, the station further comprises a second switch which, when turned on, electrically connects the power conversion device to the second charge terminal, and the overheating prevention operation is an operation in which the second processor turns the second switch off.

3. The cordless vacuum cleaner of claim 1, wherein:

the second processor is further configured to:

compare the voltage level of the voltage provided by the at least one divider resistor and the temperature sensor with a certain release voltage level; and transmit an overheating release notification to the cleaner main body through the second communication interface and the first communication interface, based on a determination according to a result of the comparison that the second charge terminal is released from an overheating state, and the first processor is further configured to control the cleaner main body to be recoupled to the station, based on the overheating release notification received through the first communication interface.

4. The cordless vacuum cleaner of claim 1, wherein:

the first charge terminal electrically contacts the second charge terminal for charging, and the cleaner main body comprises:

a first switch configured to block or provide a connection between the first charge terminal and the battery, and the first processor is further configured to control turning the first switch off based on the overheating notification received through the first communication interface, wherein turning the first switch off blocks the connection between the first charge terminal and the battery.

5. The cordless vacuum cleaner of claim 1, wherein: the temperature sensor comprises a positive temperature coefficient (PTC) thermistor or a negative temperature coefficient (NTC) thermistor, and a resistance of the temperature sensor changes according to a temperature change associated with the temperature sensor.

6. The cordless vacuum cleaner of claim 5, wherein:

the at least one divider resistor is connected to a positive power side of the input voltage, and the temperature sensor is connected to a ground, or the temperature sensor is connected to the positive power side of the input voltage, and the at least one divider resistor is connected to the ground.

7. The cordless vacuum cleaner of claim 1, wherein:

the cleaner main body comprises a first user interface, the station further comprises a second user interface, and the second processor is further configured to provide an overheating notification to a user through the second user interface based on the second processor determining that the second charge terminal is overheated, wherein the overheating notification comprises at least one of a visual alert and an audio alert.

8. The cordless vacuum cleaner of claim 1, wherein:

based on determining the second charge terminal is overheated, the second processor is further configured to provide a notification of overheating to a user terminal or a server through the second communication interface that the second charge terminal is overheated.

9. The cordless vacuum cleaner of claim 8, wherein: the station further comprises:

a first analog-digital conversion portion that detects a voltage level at a plus (+) terminal of the second charge terminal; and a second analog-digital conversion portion that detects a voltage level at a minus (−) terminal of the second charge terminal, wherein:

the second processor is further configured to determine in which terminal of the plus (+) terminal and the minus (−) terminal overheating occurs, based on the voltage level detected through the first analog-digital conversion portion and the voltage level detected and measured through the second analog-digital conversion portion, and the notification of overheating comprises information indicating in which terminal of the plus (+) terminal and the minus (−) terminal overheating occurs.

10. The cordless vacuum cleaner of claim 1, wherein:

the cleaner main body comprises a first user interface, the station further comprises a second user interface, and the second processor is further configured to:

compare the voltage level of the voltage provided by the at least one divider resistor and the temperature sensor with a certain second threshold voltage level; and control outputting, through the second user interface, a notification that charging the battery is unavailable, based on the second processor determining a temperature of the second charge terminal is lower than a certain chargeable temperature according to a result of the comparison.

11. The cordless vacuum cleaner of claim 1, wherein the second processor is further configured to correct a temperature measured by the temperature sensor based on a mapping table illustrating a difference between an actual temperature of the second charge terminal and the temperature measured by the temperature sensor installed within the certain distance from the second charge terminal.

12. A cordless vacuum cleaner comprising:

a cleaner main body; and a station, wherein the cleaner main body comprises:

a first charge terminal configured to charge a battery of the cleaner main body with a direct current (DC) voltage transmitted from the station;

a temperature sensor installed within a certain distance from the first charge terminal and configured to detect a temperature of the first charge terminal;

at least one divider resistor configured to provide a voltage by dividing the DC voltage with the temperature sensor; and a first processor configured to control performing a cleaning function powered by the battery and performing an overheating prevention operation based on a voltage level of the voltage provided by the at least one divider resistor and the temperature sensor being greater than a certain first threshold voltage level, wherein the overheating prevention operation is an operation in which the first processor is further configured to drive the cleaner main body in association with separating the cleaner main body from the station by a certain distance or more, and the station comprises:

a second charge terminal electrically connected to the first charge terminal and configured to charge the battery of the cleaner main body; and a power conversion device connected to the second charge terminal and configured to generate the DC voltage to charge the battery.

13. The cordless vacuum cleaner of claim 12, wherein the overheating prevention operation is an operation in which the first processor is further configured to turn a first switch off, the first switch connecting the battery and the first charge terminal to each other.

14. The cordless vacuum cleaner of claim 12, wherein:

the cleaner main body further comprises a first communication interface, and the overheating prevention operation is an operation in which the first processor is further configured to transmit an overheating notification to the station through the first communication interface.

15. The cordless vacuum cleaner of claim 14, wherein:

the cleaner main body comprises a first switch, the station further comprises:

a second processor; and a second switch configured to block or provide a connection between the power conversion device and the second charge terminal, and the second processor is further configured to turn the second switch off based on receiving the overheating notification, wherein turning the second switch off blocks the connection between the power conversion device and the second charge terminal.

16. The cordless vacuum cleaner of claim 12, wherein:

the cleaner main body further comprises a first communication interface and a first user interface, the station further comprises a second user interface, the first processor is further configured to:

compare the voltage level of the voltage provided by the at least one divider resistor and the temperature sensor with a certain second threshold voltage level, and output, through the first communication interface, a first notification to the station that charging the battery is unavailable, based on the first processor determining the temperature is insufficient for charging the battery according to a result of the comparison, and the station outputs a second notification that charging the battery is unavailable, through the second user interface.

17. A method of preventing overheating of a charge terminal in a cordless vacuum cleaner, the method comprising:

determining, by a temperature sensor, a voltage level corresponding to a temperature of the charge terminal while a station is electrically connected to a cleaner main body through the charge terminal, wherein determining the voltage level comprises dividing, by the temperature sensor, an input voltage with a divider resistor;

determining whether the charge terminal is overheated, by comparing the voltage level with a certain threshold voltage level; and based on determining the charge terminal being is overheated, performing an operation of separating the cleaner main body from the station.

* * * * *